US012439619B2

(12) United States Patent
Wu et al.

(10) Patent No.: US 12,439,619 B2
(45) Date of Patent: Oct. 7, 2025

(54) CASCADED BIPOLAR JUNCTION TRANSISTOR AND METHODS OF FORMING THE SAME

(71) Applicant: TAIWAN SEMICONDUCTOR MANUFACTURING COMPANY, LTD., Hsinchu (TW)

(72) Inventors: Hong-Shyang Wu, Taipei (TW); Kuo-Ming Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 271 days.

(21) Appl. No.: 17/838,894

(22) Filed: Jun. 13, 2022

(65) Prior Publication Data

US 2023/0402532 A1    Dec. 14, 2023

(51) Int. Cl.
*H10D 10/60* (2025.01)
*H10D 62/13* (2025.01)
(Continued)

(52) U.S. Cl.
CPC ........... *H10D 10/60* (2025.01); *H10D 62/133* (2025.01); *H10D 62/137* (2025.01);
(Continued)

(58) Field of Classification Search
CPC . H01L 29/735; H01L 27/082; H01L 29/0804; H01L 29/0821; H01L 29/1004;
(Continued)

(56) References Cited

U.S. PATENT DOCUMENTS 8,461,621 B2    6/2013   Chuang et al.
9,117,845 B2    8/2015   Nassar et al.
(Continued)

FOREIGN PATENT DOCUMENTS

JP    2005033020 A  *  2/2005
TW    200713819 A     4/2007
(Continued)

OTHER PUBLICATIONS

Webpage from Wikipedia showing "Darlington transistor" https://en.wikipedia.org/wiki/Darlington_transistor, accessed on Jun. 13, 2022.
(Continued)

*Primary Examiner* — Syed I Gheyas
(74) *Attorney, Agent, or Firm* — NZ Carr Law Office

(57) ABSTRACT

A device and methods of forming the same are described. The device includes a substrate and a first bipolar junction transistor (BJT) disposed over the substrate. The first BJT includes a first base region, a first emitter region, and a first collector region. The device further includes a second BJT disposed over the substrate adjacent the first BJT, and the second BJT includes a second base region, a second emitter region, and a second collector region. The device further includes an interconnect structure disposed over the first and second BJTs, and the interconnect structure includes a first conductive line electrically connected to the first emitter region and the second base region and a second conductive line electrically connected to the first collector region and the second collector region.

20 Claims, 19 Drawing Sheets

(51) Int. Cl.
*H10D 62/17* (2025.01)
*H10D 64/23* (2025.01)
*H10D 64/27* (2025.01)
*H10D 84/60* (2025.01)

(52) U.S. Cl.
CPC ......... *H10D 62/177* (2025.01); *H10D 64/231* (2025.01); *H10D 64/281* (2025.01); *H10D 84/645* (2025.01)

(58) Field of Classification Search
CPC ........ H01L 29/41708; H01L 29/42304; H10D 10/60; H10D 62/133; H10D 62/137; H10D 62/177; H10D 64/231; H10D 64/281; H10D 84/645; H10D 84/676
See application file for complete search history.

(56) References Cited

U.S. PATENT DOCUMENTS

| | | | |
|---|---|---|---|
| 10,804,220 B2 | 10/2020 | Chen et al. | |
| 2006/0261876 A1* | 11/2006 | Agarwal | H01L 31/1113 327/427 |
| 2011/0012129 A1* | 1/2011 | Zhang | H01L 21/8213 257/E29.174 |
| 2012/0032303 A1 | 2/2012 | Elkareh et al. | |
| 2012/0211639 A1* | 8/2012 | Yasukawa | G01J 1/44 250/206 |
| 2020/0294990 A1 | 9/2020 | Huang | |
| 2021/0367074 A1 | 11/2021 | Li et al. | |
| 2022/0375954 A1* | 11/2022 | Gay | H01L 27/0823 |

FOREIGN PATENT DOCUMENTS

| | | |
|---|---|---|
| TW | 200816445 A | 4/2008 |
| TW | 201539702 A | 10/2015 |

OTHER PUBLICATIONS

Office Action dated Oct. 29, 2024 of the corresponding Taiwan patent application No. 112101861.

* cited by examiner

| Device | Mean | STDEV | STDEV/Mean |
|---|---|---|---|
| Single BJT1 (Low Gain) | 5.283 | 0.021 | 0.39% |
| Single BJT2 (Low Gain) | 5.291 | 0.021 | 0.39% |
| Single BJT (High Gain) | 39.721 | 1.442 | 3.63% |
| Low Gain Cascaded BJT | 38.528 | 0.247 | 0.64% |

CASCADED BIPOLAR JUNCTION TRANSISTOR AND METHODS OF FORMING THE SAME

BACKGROUND

Bipolar junction transistors (BJTs) are commonly used in digital and analog integrated circuit (IC) devices for high frequency applications. A BJT includes two p-n junctions sharing a cathode or anode region, which is called the base. The base separates two regions having a same conductivity type, called the emitter and collector, which is opposite the conductivity type of the base. Depending on the conductivity types, a BJT can be of the NPN variety or the PNP variety.

There is a tradeoff between the breakdown voltage between the collector and emitter terminals when the base terminal is open ($BV_{CEO}$) and the current gain (beta gain). Therefore, an improved BJT is needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
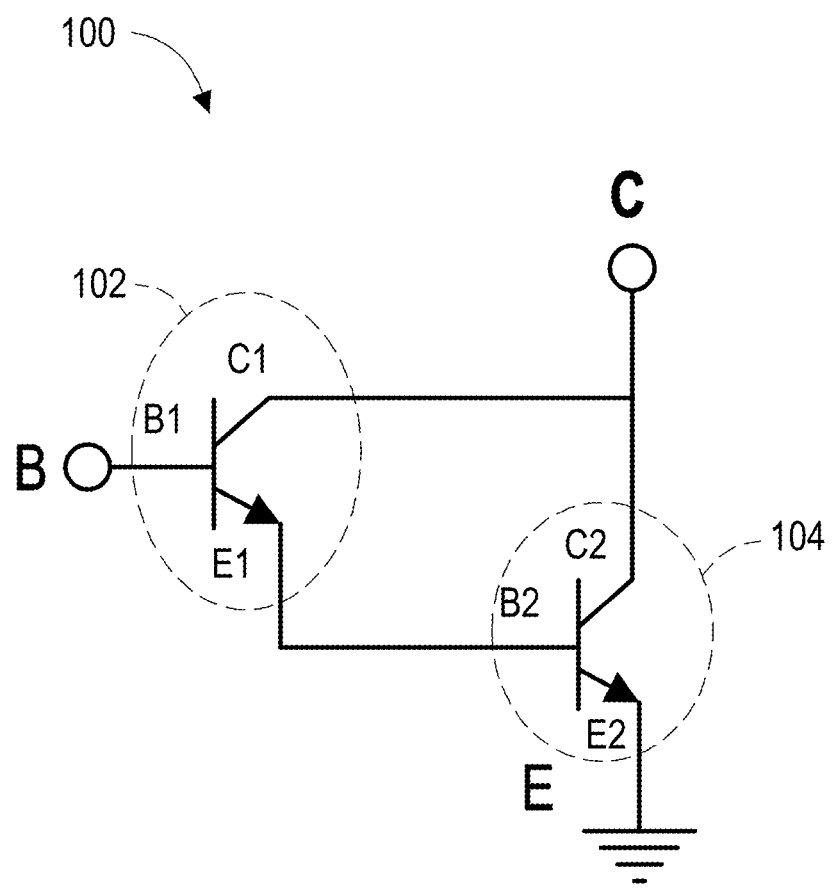
FIG. 1A is a circuit diagram of a cascaded BJT, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Some variation of the example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIG. 1A is a circuit diagram of a cascaded BJT 100, in accordance with some embodiments. As shown in FIG. 1A, the cascaded BJT 100 includes a first BJT 102 connected to a second BJT 104. The first BJT 102 includes a first collector C1, a first base B1, and a first emitter E1. The second BJT 104 includes a second collector C2, a second base B2, and a second emitter E2. The first emitter E1 is connected to the second base B2, and the first collector C1 is connected to the second collector C2. The cascaded BJT 100 behaves like a single BJT and includes a collector C, a base B, and an emitter E. The cascaded BJT 100 may be referred to as a Darlington transistor. The first and second BJTs 102, 104 may be referred to as Darlington pair. Generally, the relationship between the compound current gain and the individual gains is given by:

$$\beta_{100} = \beta_{102} \times \beta_{104} + \beta_{102} + \beta_{104}$$

where $\beta_{100}$ is the current gain of the cascaded BJT 100, $\beta_{102}$ is the current gain of the BJT 102, and $\beta_{104}$ is the current gain of the cascaded BJT 104. If $\beta_{102}$ and $\beta_{104}$ are high enough, such as in the hundreds or more, the relationship can be approximated with:

$$\beta_{100} \approx \beta_{102} \times \beta_{104}$$

Thus, the cascaded BJT 100 has a much higher current gain than each BJT 102, 104 taken separately. However, there is a tradeoff between current gain and $BV_{CEO}$, and high current gain and high $BV_{CEO}$ cannot be obtained simultaneously. Furthermore, traditional Darlington transistors are formed from discrete devices having high electrical resistance.

In some embodiments, the cascaded BJT 100 is formed on a substrate. In other words, the cascaded BJT 100 is part of an integrated circuit (IC). For example, by connecting the BJT 102 and BJT 104 formed on the substrate using conductive features formed in an interconnect structure, the current gain of the cascaded BJT 100 is high while the $BV_{CEO}$ is maintained. The cascaded BJT 100 formed on the substrate decouples the inverse proportional relationship between the current gain and the $BV_{CEO}$. In addition, the process to make the cascaded BJT 100 is compatible with the standard bipolar complementary metal-oxide-semiconductor (CMOS) double-diffused metal-oxide-semiconductor (DMOS) (BCD) process. Furthermore, yield and uniformity are improved while the cost is low (no additional masks).

Figure 1B:
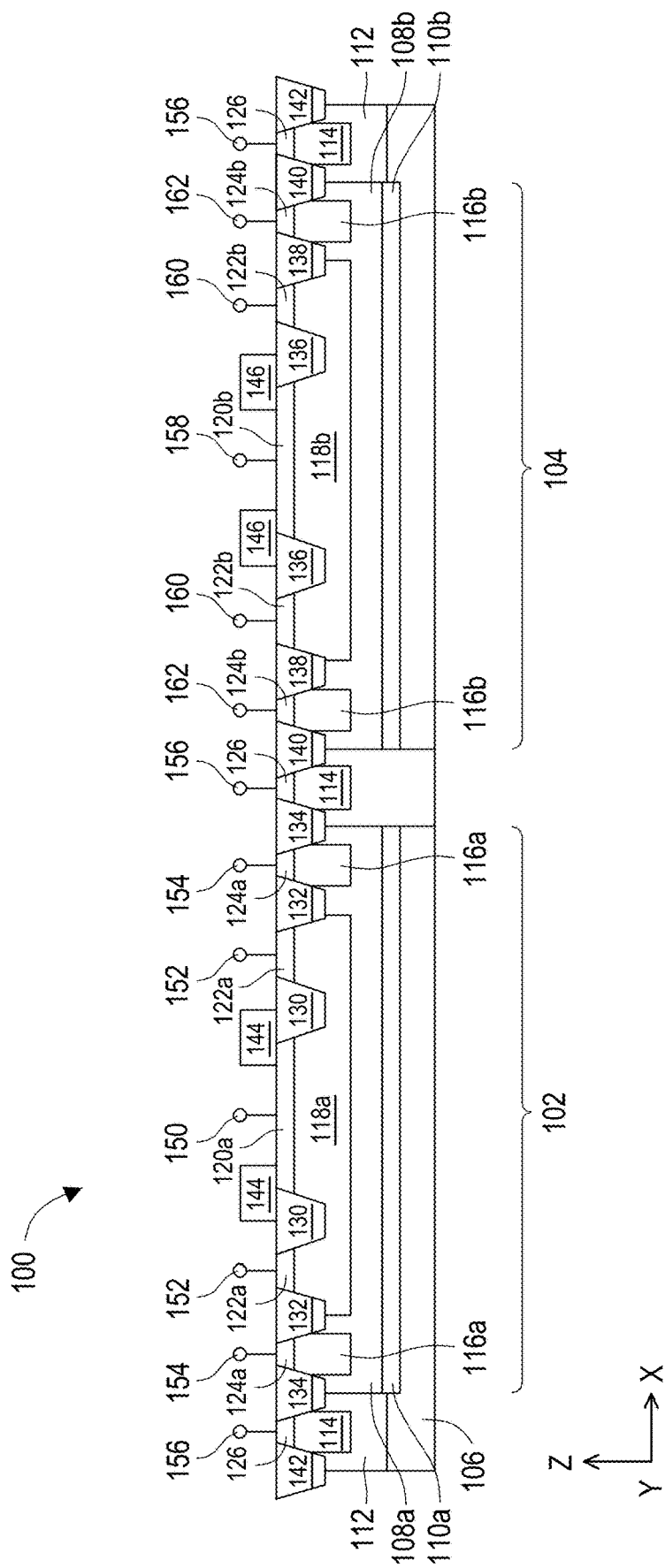
FIG. 1B is a cross-sectional side view of BJTs of the cascaded BJT of FIG. 1A, in accordance with some embodiments.

FIG. 1B is a cross-sectional side view of the BJTs 102, 104 of the cascaded BJT 100 of FIG. 1, in accordance with some embodiments. As shown in FIG. 1B, the BJTs 102, 104 are disposed over a substrate 106. The substrate 106 may be a semiconductor substrate such as a silicon wafer. Alternatively, the substrate 106 may include other elementary semiconductors such as germanium. The substrate 106 may also include a compound semiconductor such as silicon carbide, gallium arsenic, indium arsenide, and indium phosphide. Moreover, the substrate 106 may include an alloy semiconductor such as silicon germanium, silicon germanium carbide, gallium arsenic phosphide, and gallium indium phosphide. Furthermore, the substrate 106 may include a semiconductor-on-insulator (SOI) structure. For example, the substrate 106 may include a buried oxide (BOX) layer formed by a process such as separation by implanted oxygen (SIMOX). In some embodiments, illustrated as NPN BJTs 102, 104, the substrate 106 includes a P-type silicon substrate (p-substrate). For example, P-type dopants are introduced into the substrate 106 to form the p-substrate.

In the BJT 102, an N-type doped region (NDD) (or N-type drift region) 108a is formed over the substrate 106. In some embodiments, the NDD 108a is formed by ion-implantation, diffusion techniques, or other suitable techniques. For example, an N-well mask is used to pattern a photoresist layer in a photolithography process or other suitable process. An exemplary photolithography process may include processing steps of photoresist coating, soft baking, mask aligning, exposing, post-exposure baking, developing, and hard baking. An ion implantation utilizing an N-type dopant, such as arsenic or phosphorus, may be performed to form the NDD 108a in the substrate 106. In some embodiments, an N-type buried layer (NBL) 110a is disposed between the NDD 108a and the substrate 106. The NBL 110a functions as an isolation layer to isolate the NDD 108a and the substrate 106. The NDD 108a is surrounded by a P-type doped region (PDD) (or P-type drift region) 112. The PDD 112 may also function as an isolation region to isolate the BJT 102 and the BJT 104. Thus, in some embodiments, the depth of the PDD 112 is substantially deeper than the depth of the NDD 108a.

In some embodiments, a shallow low-voltage N-type well (SHN) 116a is formed in the NDD 108a. The dopant concentration of the SHN 116a may be greater than the dopant concentration of the NDD 108a. A P-type well (PW) 118a is formed in the NDD 108a. The PW 118a may be surrounded by the SHN 116a, which may have a continuous loop layout.

An emitter region 120a is formed on the PW 118a. In some embodiments, the emitter region 120a includes an N-type dopant. The emitter region 120a may have a polygonal-shaped layout (e.g., square, rectangle, etc.). In some embodiments, the emitter region 120a may be concentric about a center point of the BJT 102. A plurality of contacts 150 is disposed on the emitter region 120a.

A base region 122a is formed on the PW 118a. In some embodiments, the base region 122a includes a P-type dopant. The dopant type of the base region 122a may be opposite to the dopant type of the emitter region 120a. In some embodiments, the base region 122a has a continuous loop layout, and the base region 122a surrounds the emitter region 120a. A plurality of contacts 152 is disposed on the base region 122a. An isolation region 130 is disposed in the NDD 108a between the emitter region 120a and the base region 122a. In some embodiments, the isolation region 130 is a shallow trench isolation (STI) that includes a dielectric material, such as silicon oxide or other suitable dielectric material.

A resist protector oxide (RPO) 144 is formed on the emitter region 120a to block the formation of silicide on the edge portion of the emitter region 120a. The RPO 144 may have a continuous loop layout. As shown in FIG. 1B, the RPO 144 may be disposed on both the emitter region 120a and the isolation region 130.

A collector region 124a is formed on the SHN 116a. In some embodiments, the collector region 124a includes an N-type dopant. The dopant type of the collector region 124a may be opposite to the dopant type of the base region 122a and may be the same dopant type as the emitter region 120a. A plurality of contacts 154 is disposed on the collector region 124a. An isolation region 132 is disposed between the collector region 124a and the base region 122a. The isolation region 132 may include the same material as the isolation region 130.

In some embodiments, the BJT 102 is an NPN type BJT and includes the N-type collector region 124a, P-type base region 122a, and N-type emitter region 120a. In some embodiments, the BJT 102 is a PNP type BJT and includes a P-type collector region 124a, an N-type base region 122a, and a P-type emitter region 120a. The dopant types of the other regions in the substrate 106 may be opposite of the dopant types of the regions shown in FIG. 1B. For example, in some embodiments, the NBL 110a is a P-type buried layer (PBL), the NDD 108a is a P-type doped region (PDD), the PW 118a is an N-type well (NW), and the SHN 116a is a shallow low-voltage P-type well (SHP).

A shallow low-voltage P-type well (SHP) 114 may be formed in the PDD 112 to surround the BJT 102. In some embodiments, the SHP 114 may include two continuous loops, one surrounding the BJT 102, and the other surrounding the BJT 104. A P-type region 126 is formed on the SHP 114, and a plurality of contacts 156 is formed on the P-type region 126. The P-type region 126 may be a substrate isolation region. An isolation region 134 is formed between the collector region 124a and the P-type region 126. The isolation region 134 may include the same material as the isolation region 130. An isolation region 142 may be formed to surround the BJTs 102, 104. The isolation region 142 may include the same material as the isolation region 130.

The various doped regions in the substrate 106, such as the NBL 110a, the NDD 108a, the PDD 112, the SHP 114, the SHN 116a, the PW 118a, the emitter region 120a, the base region 122a, the collector region 124a, and the P-type region 126 may be formed by using multiple masks to implant or diffuse various dopants to different depths of the substrate 106. The isolation regions 130, 132, 134, and 142 may be formed by forming openings in the substrate 106 and then filling the openings with the dielectric material of the isolation regions 130, 132, 134, and 142.

In some embodiments, as shown in FIG. 1B, the BJT 104 is disposed adjacent the BJT 102. In the BJT 104, an NDD 108b is formed over the substrate 106, and an NBL 110b is disposed between the NDD 108b and the substrate 106. The NBL 110b functions as an isolation layer to isolate the NDD 108b and the substrate 106. The NDD 108b is surrounded by the PDD 112. In some embodiments, the depth of the PDD 112 is substantially deeper than the depth of the NDD 108b. In some embodiments, the PDD 112 also separates the NBLs 110a, 110b. Thus, the bottom of the PDD 112 may be substantially below the bottom of the NBLs 110a, 110b.

In some embodiments, a SHN 116b and a PW 118b are formed in the NDD 108b. The PW 118b may be surrounded by the SHN 116b, which may have a continuous loop layout.

An emitter region 120b is formed on the PW 118b. The emitter region 120b may have a polygonal-shaped layout (e.g., square, rectangle, etc.). In some embodiments, the emitter region 120b may be concentric about a center point of the BJT 104. A plurality of contacts 158 is disposed on the emitter region 120a.

A base region 122b is formed on the PW 118b. In some embodiments, the base region 122b includes a P-type dopant. The dopant type of the base region 122b may be opposite to the dopant type of the emitter region 120b. In some embodiments, the base region 122b has a continuous loop layout, and the base region 122b surrounds the emitter region 120b. A plurality of contacts 160 is disposed on the base region 122b. An isolation region 136 is disposed in the NDD 108b between the emitter region 120b and the base region 122b. The isolation region 136 may include the same material as the isolation region 130.

An RPO 146 is formed on the emitter region 120b to block the formation of suicide on the edge portion of the emitter region 120b. The RPO 146 may have a continuous loop layout. As shown in FIG. 1B, the RPO 146 may be disposed on both the emitter region 120b and the isolation region 136.

A collector region 124b is formed on the SHN 116b. In some embodiments, the collector region 124b includes an N-type dopant. The dopant type of the collector region 124b may be opposite to the dopant type of the base region 122b and may be the same dopant type as the emitter region 120b. A plurality of contacts 162 is disposed on the collector region 124b. An isolation region 138 is disposed between the collector region 124b and the base region 122b. The isolation region 138 may include the same material as the isolation region 130.

Similar to the BJT 102, the various doped regions in the substrate 106, such as the NBL 110b, the NDD 108b, the SHN 116b, the PW 118b, the emitter region 120b, the base region 122b, and the collector region 124b may be formed by using multiple masks to implant or diffuse various dopants to different depths of the substrate 106. The isolation regions 136, 138, and 140 may be formed by forming openings in the substrate 106 and then filling the openings with the dielectric material of the isolation regions 136, 138, and 140.

In some embodiments, the BJT 104 is an NPN type BJT and includes the N-type collector region 124b, P-type base region 122b, and N-type emitter region 120b. In some embodiments, the BJT 104 is a PNP type BJT and includes a P-type collector region 124b, an N-type base region 122b, and a P-type emitter region 120b. The dopant types of the other regions in the substrate 106 may be opposite of the dopant types of the regions shown in FIG. 1B. For example, in some embodiments, the NBL 110b is a PBL, the NDD 108b is a PDD, the PW 118b is an NW, and the SHN 116b is a SHP. In some embodiments, the BJT 102 and the BJT 104 are the same type of BJT. For example, the BJT 102 is an NPN type BJT and the BJT 104 is an NPN type BJT.

As described above, the PDD 112, the SHP 114, and the P-type region 126 separate the BJT 102 from the BJT 104. In some embodiments, the BJT 102 and the BJT 104 are identical, such that the sizes of the regions and the dopant concentrations of the regions of the BJT 102 and the BJT 104 are substantially the same. In some embodiments, the sizes of the regions and/or the dopant concentrations of the regions of the BJT 102 and the BJT 104 are substantially different in order to achieve higher $BV_{CEO}$. For example, in some embodiments, the BJT 102 has a first $BV_{CEO}$, and the BJT 104 has a second $BV_{CEO}$ substantially greater than the first $BV_{CEO}$. The BJTs 102, 104 having different $BV_{CEO}$ are described in FIGS. 2B and 3.

Figure 1C:
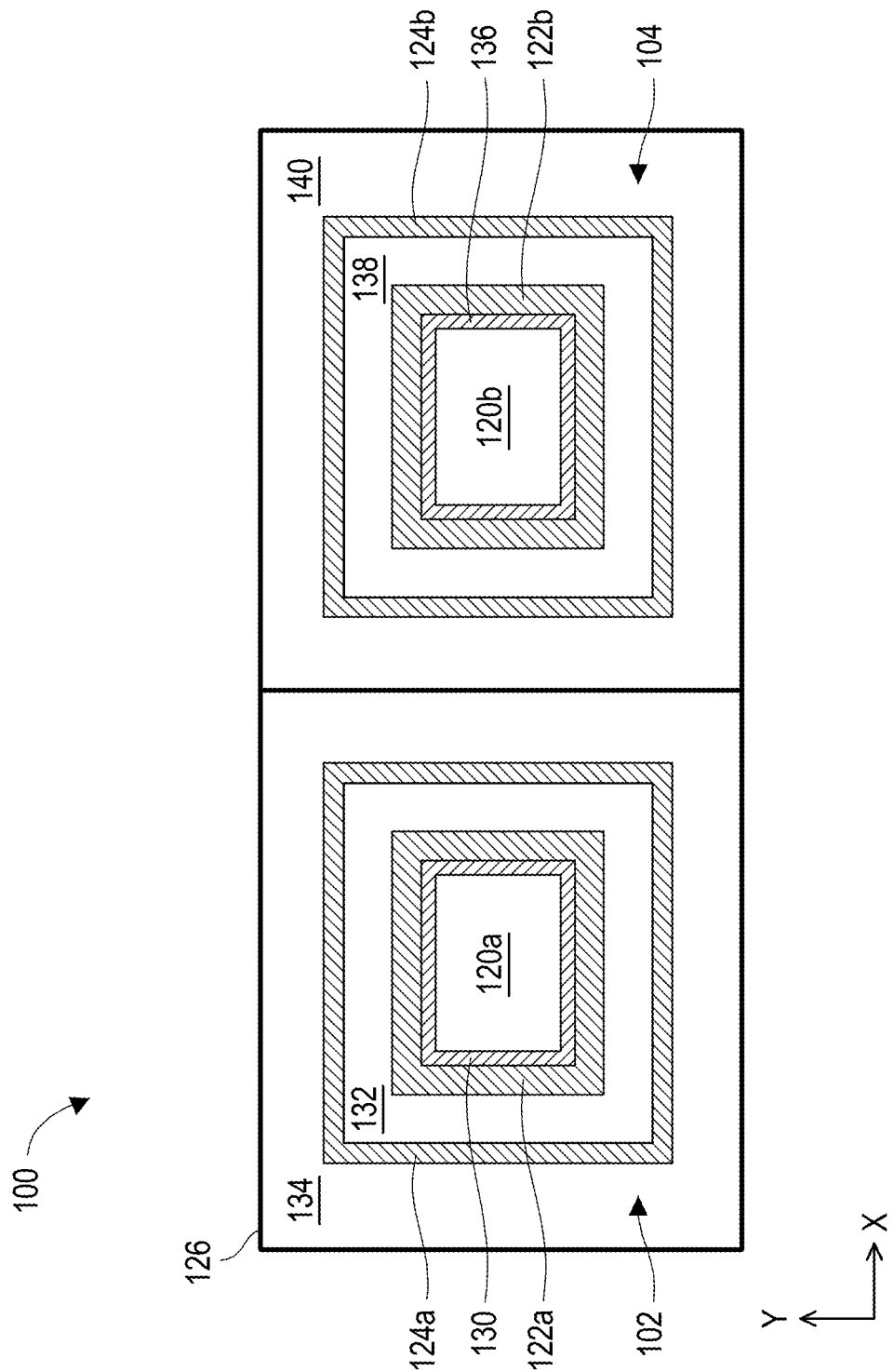
FIG. 1C is a top view of the BJTs of FIG. 1B, in accordance with some embodiments.

FIG. 1C is a top view of the BJTs 102, 104 of FIG. 1B, in accordance with some embodiments. As shown in FIG. 1C, the BJT 102 is disposed adjacent the BJT 104. The BJT 102 includes the emitter region 120a, the isolation region 130 surrounding the emitter region 120a, the base region 122a surrounding the isolation region 130, the isolation region 132 surrounding the base region 122a, and the collector region 124a surrounding the isolation region 132. The isolation region 134 surrounds the collector region 124a, and the P-type region 126 surrounds the isolation region 134. In some embodiments, the above-mentioned regions 102a, 130, 122a, 132, 124a, 134, and 126 all have continuous loop layouts. In some embodiments, the continuous loop is a continuous square, as shown in FIG. 1C. The continuous loop may be any suitable shape.

As shown in FIG. 1C, the BJT 104 includes the emitter region 120b, the isolation region 136 surrounding the emitter region 120b, the base region 122b surrounding the isolation region 136, the isolation region 138 surrounding the base region 12b, and the collector region 124b surrounding the isolation region 138. The isolation region 140 surrounds the collector region 124b, and the P-type region 126 surrounds the isolation region 140. In some embodiments, the above-mentioned regions 102b, 136, 122b, 138, and 124b all have continuous loop layouts. In some embodiments, the continuous loop is a continuous square, as shown in FIG. 1C. The continuous loop may be any suitable shape. The P-type region 126 may include two continuous loop layout, one of the two continuous loops surrounds the BJT 102, and the other of the two continuous loops surrounds the BJT 104.

Figure 2A:
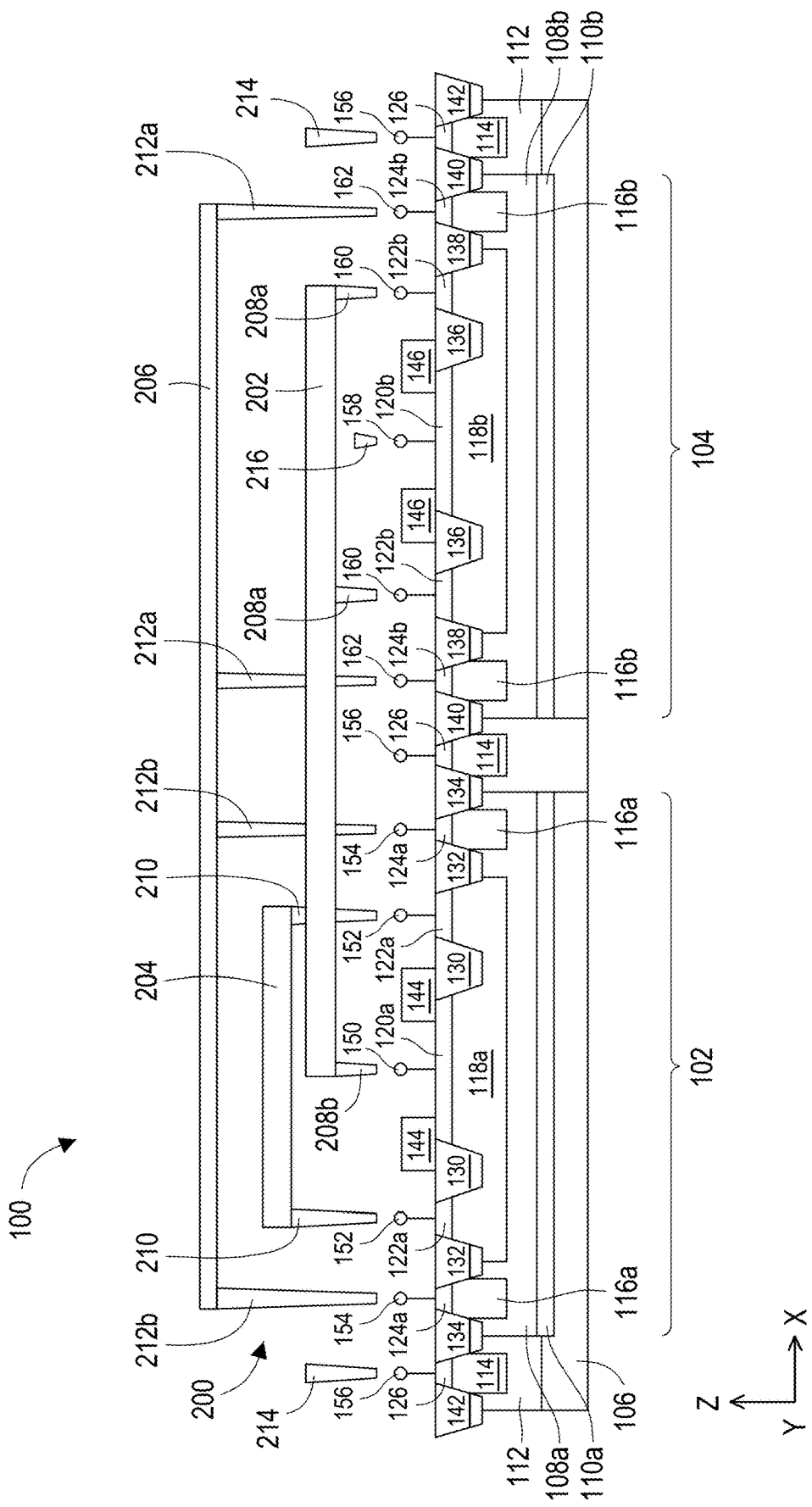
FIG. 2A is a cross-sectional side view of the cascaded BJT of FIG. 1A, in accordance with some embodiments.

FIG. 2A is a cross-sectional side view of the cascaded BJT of FIG. 1A, in accordance with some embodiments. In some embodiments, the BJTs 102, 104 are cascaded to form the cascaded BJT 100 shown in FIG. 1A. For example, an interconnect structure 200 is formed over the substrate 106. The interconnect structure 200 includes a plurality of conductive features embedded in a dielectric material (not shown). In some embodiments, the interconnect structure 200 includes at least three conductive lines 202, 204, 206 and a plurality of conductive vias 208a-b, 210, 212a-b, 214, 216. In some embodiments, the conductive line 202 is electrically connected to the emitter region 120a of the BJT 102 and the base region 122b of the BJT 104. For example, the emitter region 120a of the BJT 102 is electrically connected to one or more conductive vias 208b through the contacts 150, the base region 122b of the BJT 104 is electrically connected to one or more conductive vias 208a through the contacts 160, and the conductive vias 208a, 208b are electrically connected to the conductive line 202. In some embodiments, the conductive line 204 is electrically connected to the base region 122a of the BJT 102. For example, the base region 122a of the BJT 102 is electrically connected to one or more conductive vias 210 through the contacts 152, and the conductive vias 210 are electrically connected to the conductive line 204. In some embodiments, the conductive line 206 is electrically connected to the collector region 124a of the BJT 102 and the collector region 124b of the BJT 104. For example, the collector region 124a of the BJT 102 is electrically connected to one or more conductive vias 212b through the contacts 154, the collector region 124b of the BJT 104 is electrically connected to one or more conductive vias 212a through the contacts 162, and the conductive vias 212a, 212b are electrically connected to the conductive line 206. As a result, the BJTs 102, 104 are cascaded to form the cascaded BJT 100 as shown in FIG. 1A.

As described above, the cascaded BJT 100 formed over the substrate 106 has low electrical resistance due to the proximity of the BJTs 102, 104 and the conductive lines 202, 204, 206 and conductive vias 208a-b, 210, 212a-b, 214, 216 in the interconnect structure 200. Furthermore, the process to form the cascaded BJT 100 is compatible with the BCD process. In some embodiments, as shown in FIG. 2A, the conductive lines 202, 204, 206 are located at different levels within the interconnect structure 200. For example, the conductive line 202 electrically connecting the emitter region 120a of the BJT 102 and the base region 122b of the BJT 104 is located at the first level closest to the BJTs 102, 104, the conductive line 204 electrically connecting the base region 122a of the BJT 102 is located at the second level above the first level, and the conductive line 206 electrically connecting the collector region 124a of the BJT 102 and the collector region 124b of the BJT 104 is located at the third level above the second level. The conductive line 206 is located furthest to the BJTs 102, 104 in order to reduce parasitic capacitance due to the high voltage applied to the collector regions 124a, 124b.

The conductive lines 202, 204, 206 and the conductive vias 208a-b, 210, 212a-b, 214, 216 shown in FIG. 2A may be disposed at different locations along the y-axis and may not be all shown in a cross-section in the x-z plane. Thus, at least some of the conductive lines 202, 204, 206 and the conductive vias 208a-b, 210, 212a-b, 214, 216 may not be visible at the cross-section shown in FIG. 2A and are shown for illustration purpose only. Additional conductive vias and/or lines may be omitted for clarity. For example, a conductive line (not shown) may be electrically connected to the emitter region 120b of the BJT 104 through one or more conductive vias 216 and the contacts 158, and a conductive line (not shown) may be electrically connected to the P-type region 126 through one or more conductive vias 214 and the contacts 156.

Figure 2B:
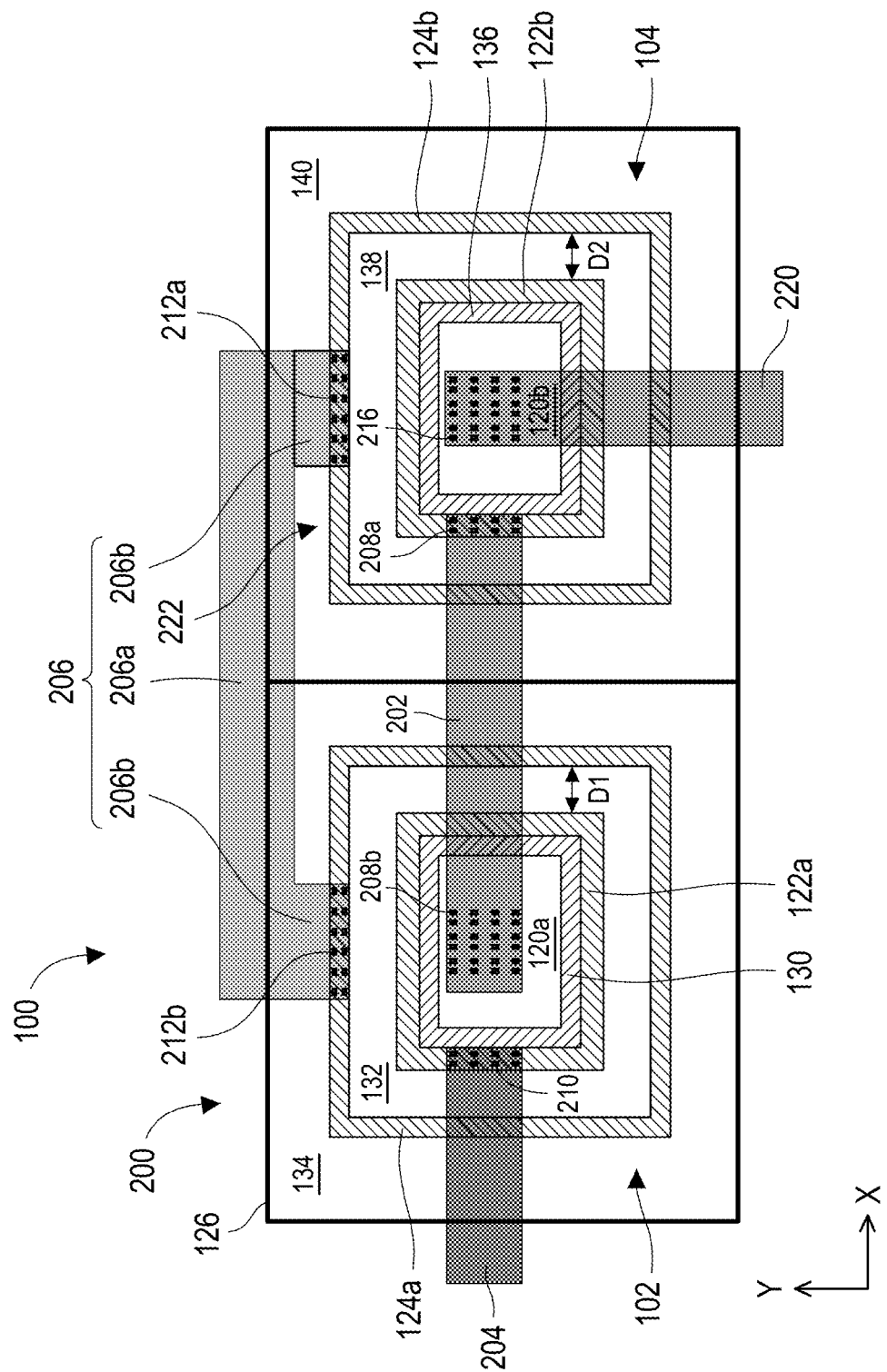
FIG. 2B is a top view of the cascaded BJT of FIG. 1A, in accordance with some embodiments.

FIG. 2B is a top view of the cascaded BJT 100 of FIG. 1A, in accordance with some embodiments. As shown in FIG. 2B, the interconnect structure 200 is disposed over the BJTs 102, 104. The dielectric material of the interconnect structure 200 is omitted for clarity. The conductive line 202 electrically connects the emitter region 120a of the BJT 102 and the base region 122b of the BJT 104 through the conductive vias 208b, 208a. The conductive line 204 is electrically connected to the base region 122a of the BJT 102 through the conductive vias 210, and a conductive line 220 is electrically connected to the emitter region 120b of the BJT 104 through the conductive vias 216. The conductive line 206 electrically connects the collector region 124a of the BJT 102 and the collector region 124b of the BJT 104 through the conductive vias 212b, 212a. In some embodiments, the conductive lines 202, 204, 206, 220 are located at different levels of the interconnect structure 200. In some embodiments, the conductive lines 202, 204, 206, 220 are located at the same level of the interconnect structure 200. As shown in FIG. 2B, in some embodiments, the conductive line 206 may have an "n" shape when viewed from the top. For example, the conductive line 206 includes a first portion 206a and second portions 206b extending from edges of the first portion 206a. The second portions 206b are disposed over and electrically connected to the collector regions 124a, 124b, and the first portion 206a is not disposed over the collector regions 124a, 124b. Because a high voltage may be applied to the conductive line 206, the first portion 206a, which may be the main portion of the conductive line 206, is located away from the BJTs 102, 104 in order to reduce parasitic capacitance. In some embodiments, a gap 222 is formed between the second portions 206b. In some embodiments, the first portion 206a and the second portions 206b of the conductive line 206 are formed at the same level of the interconnect structure 200. As described in FIG. 1A, the cascaded BJT 100 includes the collector C, the base B, and the emitter E. The conductive line 204 may be the base terminal of the cascaded BJT 100, the conductive line 220 may be the emitter terminal of the cascaded BJT 100, and the conductive line 206 may be the collector terminal of the cascaded BJT 100.

In some embodiments, the BJTs 102, 104 are identical in size and dopant concentration of various regions. For example, the BJT 102 and the BJT 104 may be symmetrical with respect to a portion of the P-type region 126 disposed between the BJT 102 and the BJT 104. In some embodiments, the BJT 104 has a larger $BV_{CEO}$ than that of the BJT 102 in order to have an increased $BV_{CEO}$ for the cascaded BJT 100. The difference in $BV_{CEO}$ may be achieved by various configurations of the BJTs 102, 104. In some embodiments, the dopant concentration of the one or more regions of the BJT 104 may be substantially different from the dopant concentration of the corresponding regions of the BJT 102. Referring back to FIG. 2A, in some embodiments, the dopant concentrations of the NDD 108b, the SHN 116b, and the collector region 124b of the BJT 104 may be substantially less than the dopant concentrations of the NDD 108a, the SHN 116a, and the collector region 124a of the BJT 102, respectively. As a result, the $BV_{CEO}$ of the BJT 104 is substantially larger than the $BV_{CEO}$ of the BJT 102. In some embodiments, the difference in the $BV_{CEO}$ of the BJTs 102, 104 may be a result of different distances between the base regions 122a, 122b and the collector regions 124a, 124b. For example, referring back to FIG. 2B, the collector region 124a and the base region 122a of the BJT 102 are continuous square loops and are separated by a distance D1. The collector region 124b and the base region 122b of the BJT 104 are continuous rectangular loops, and the collector region 124b and the base region 122b of the BJT 104 are separated by a distance D2 substantially greater than the distance D1. In some embodiments, the distance D1 and the distance D2 are the widths of the isolation regions 132, 138, respectively.

In some embodiments, the BJT 104 includes regions with rectangular loop layouts. For example, the isolation region 138 may have a first width in the x-axis and a second width along the y-axis, and the first width may be substantially greater than the second width. In some embodiments, the first width may be the same as the distance D2, and the second width may be the same as the distance D1. The collector region 124b and the base region 122b are distance D1 away from each other in the y-axis and are distance D2 away from each other in the x-axis, and the distance D2 is substantially greater than the distance D1. As a result, the $BV_{CEO}$ of the BJT 104 is substantially greater than the $BV_{CEO}$ of the BJT 102.

Figure 3:
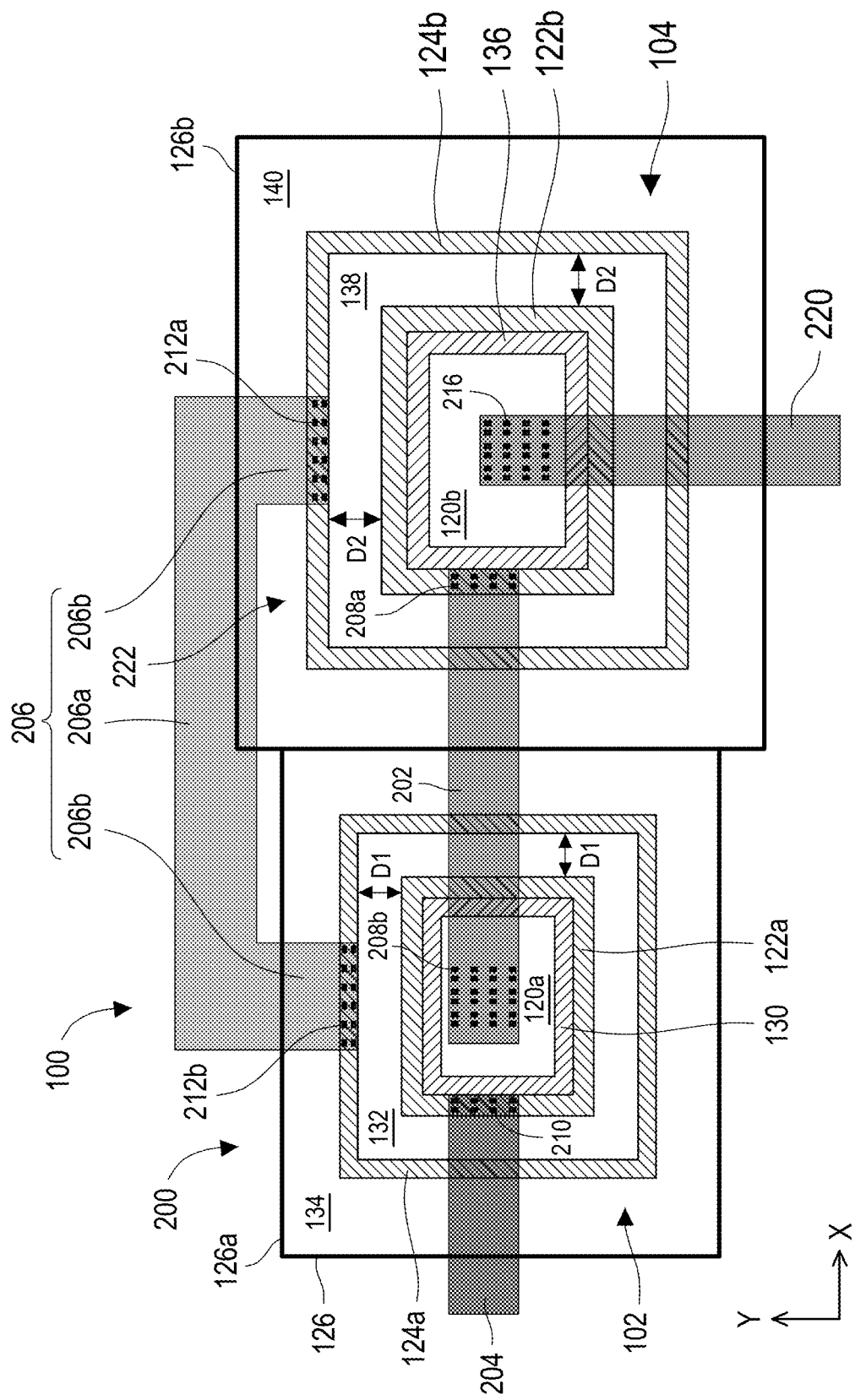
FIG. 3 is a top view of the cascaded BJT of FIG. 1A, in accordance with alternative embodiments.

In some embodiments, as shown in FIG. 3, the BJT 104 includes regions with square loop layouts that are substantially larger than the square loop layouts of the regions of the BJT 102. For example, as shown in FIG. 3, each square loop layout of the regions 120b, 136, 122b, 138, 124b, 140 of the BJT 104 is substantially larger than the square loop layout of the corresponding regions 120a, 130, 122a, 132, 124a, 134 of the BJT 102. In some embodiments, the isolation region 138 may have a first width in the x-axis and in the y-axis, the isolation region 132 may have a second width in the x-axis and in the y-axis, and the first width is substantially greater than the second width. The first width may be the same as the distance D2, and the second width may be the same as the distance D1. The collector region 124b and the base region 122b are distance D2 away from each other in both the x-axis and y-axis, the collector region 124a and the base region 122a are distance D1 away from each other in both the x-axis and y-axis, and the distance D2 is substantially greater than the distance D1. As a result, the BV CEO of the BJT 104 is substantially greater than the $BV_{CEO}$ of the BJT 102.

In some embodiments, as shown in FIG. 3, the BJT 102 and the BJT 104 are asymmetrical with respect to the portion of the P-type region 126 disposed between the BJT 102 and the BJT 104. For example, at least the size of one of the base region 122a, the emitter region 120a, and the collector region 124a is different from the size of the corresponding base region 122b, the emitter region 120b, and the collector region 124b. As shown in FIG. 3, the emitter region 120b is substantially larger than the emitter region 120a, the base region 122b is substantially larger than the base region 122a, and the collector region 124b is substantially larger than the collector region 124a. In some embodiments, the P-type region 126 includes a first continuous loop 126a surrounding the BJT 102 and a second continuous loop 126b surrounding the BJT 104, and the second continuous loop 126b is substantially larger than the first continuous loop 126a. In some embodiments, the second portion 206b electrically connected to the collector region 124a of the BJT 102 may be substantially larger than the second portion 206b electrically connected to the collector region 124b of the BJT 104, as shown in FIG. 3.

Figure 4:
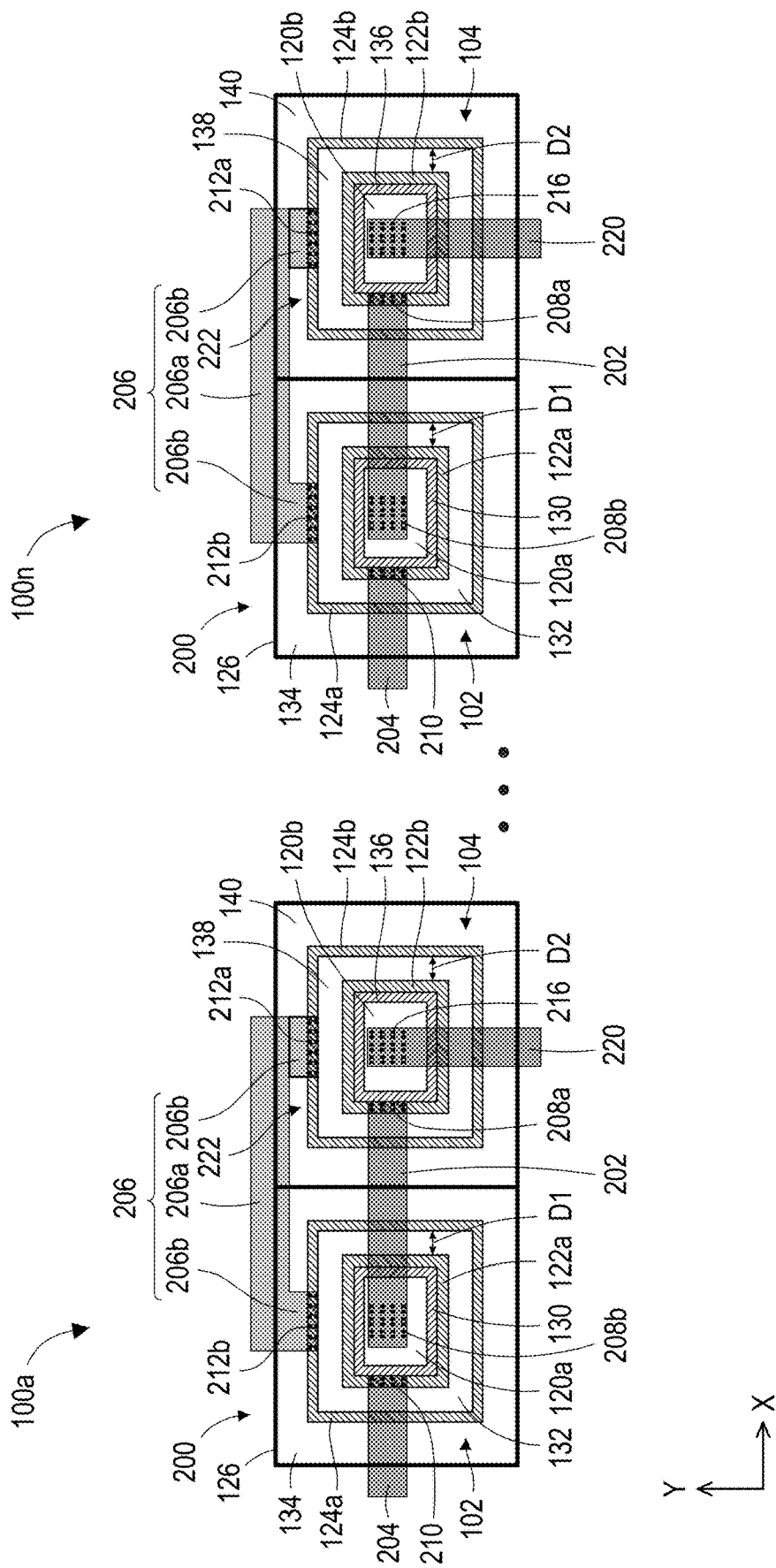
FIG. 4 is a top view of the cascaded BJTs of FIG. 1A connected in series, in accordance with alternative embodiments.

FIG. 4 is a top view of the cascaded BJTs 100 of FIG. 1A connected in series, in accordance with alternative embodiments. In some embodiments, multiple cascaded BJTs 100a-n are connected in series to form an array of cascaded BJTs 100. As described above, the cascaded BJT 100a includes base, emitter, and collector terminals. The conductive line 204 may be the base terminal of the cascaded BJT 100a, the conductive line 220 may be the emitter terminal of the cascaded BJT 100a, and the conductive line 206 may be the collector terminal of the cascaded BJT 100a. A cascaded BJT 100b (represented by dots) is connected to the cascaded BJT 100a in series. The cascaded BJT 100b includes a first conductive line representing the base terminal, a second conductive line representing the emitter terminal, and a third conductive line representing the collector terminal. In some embodiments, the conductive line 206 of the cascaded BJT 100a is electrically connected to the third conductive line of the cascaded BJT 100b, and the conductive line 220 of the cascaded BJT 100a is electrically connected to the first conductive line of the cascaded BJT 100b. As a result, the cascaded BJTs 100a, 100b are connected to form a cascaded BJT having four BJTs. The cascaded BJT having four BJTs may be connected to another cascaded BJT having four BJTs to form a cascaded BJT having eight BJTs. As a result, the multiple cascaded BJTs 100a-n includes a base terminal, an emitter terminal, and a collector terminal, and the current gain is substantially increased while maintaining the $BV_{CEO}$.

Figure 5:
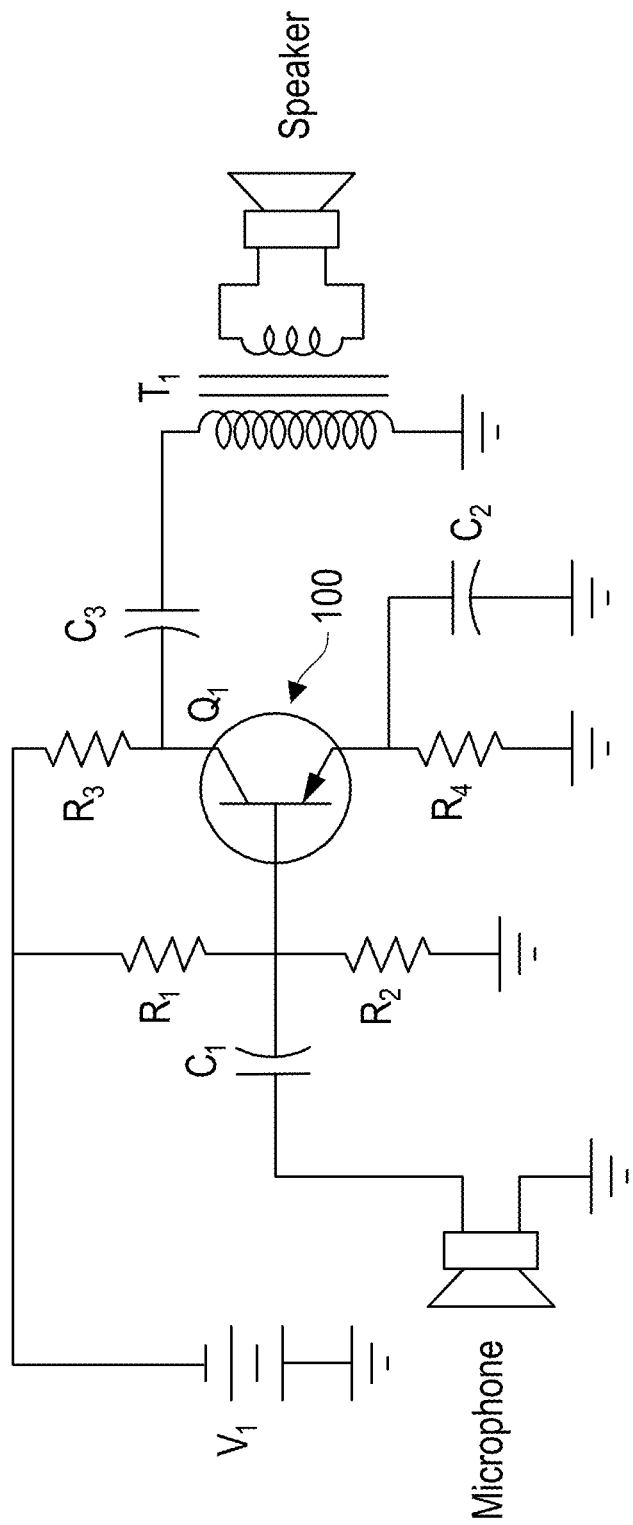
FIG. 5 is a circuit diagram of an audio amplifier including the cascaded BJT of FIG. 1A, in accordance with some embodiments.

FIG. 5 is a circuit diagram of an audio amplifier including the cascaded BJT 100 of FIG. 1A, in accordance with some embodiments. The cascaded BJT 100 may be used in any suitable application. In some embodiments, the cascaded BJT 100 is used in an audio amplifier. For example, the large current gain from the cascaded BJT 100 provides a greater range of various sound effects, such as bass, treble, or other suitable effects.

Figure 6A:
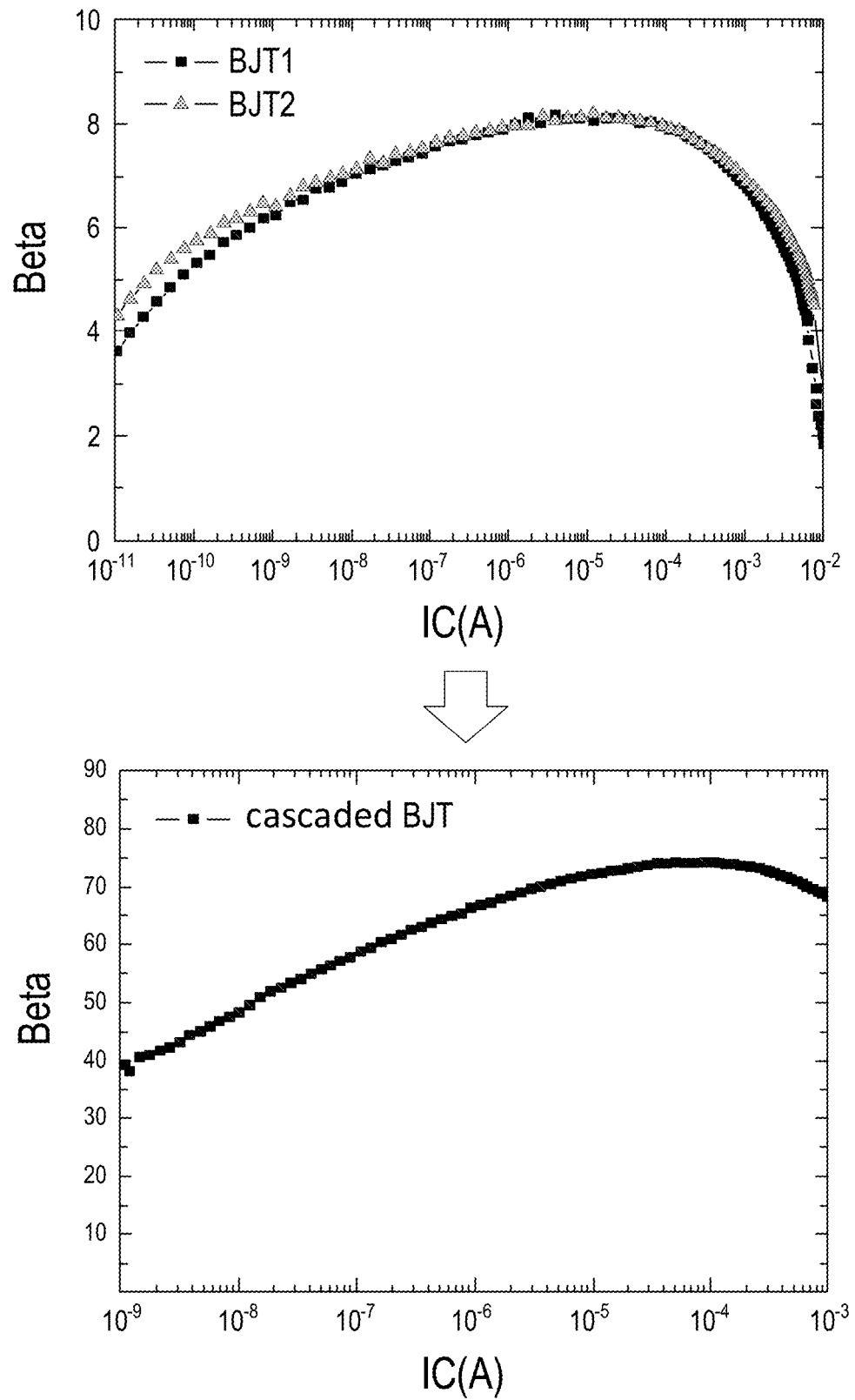
FIGS. 6A-6C are charts showing comparisons of individual low gain BJTs and low gain cascaded BJT, in accordance with some embodiments.
Figure 6B:
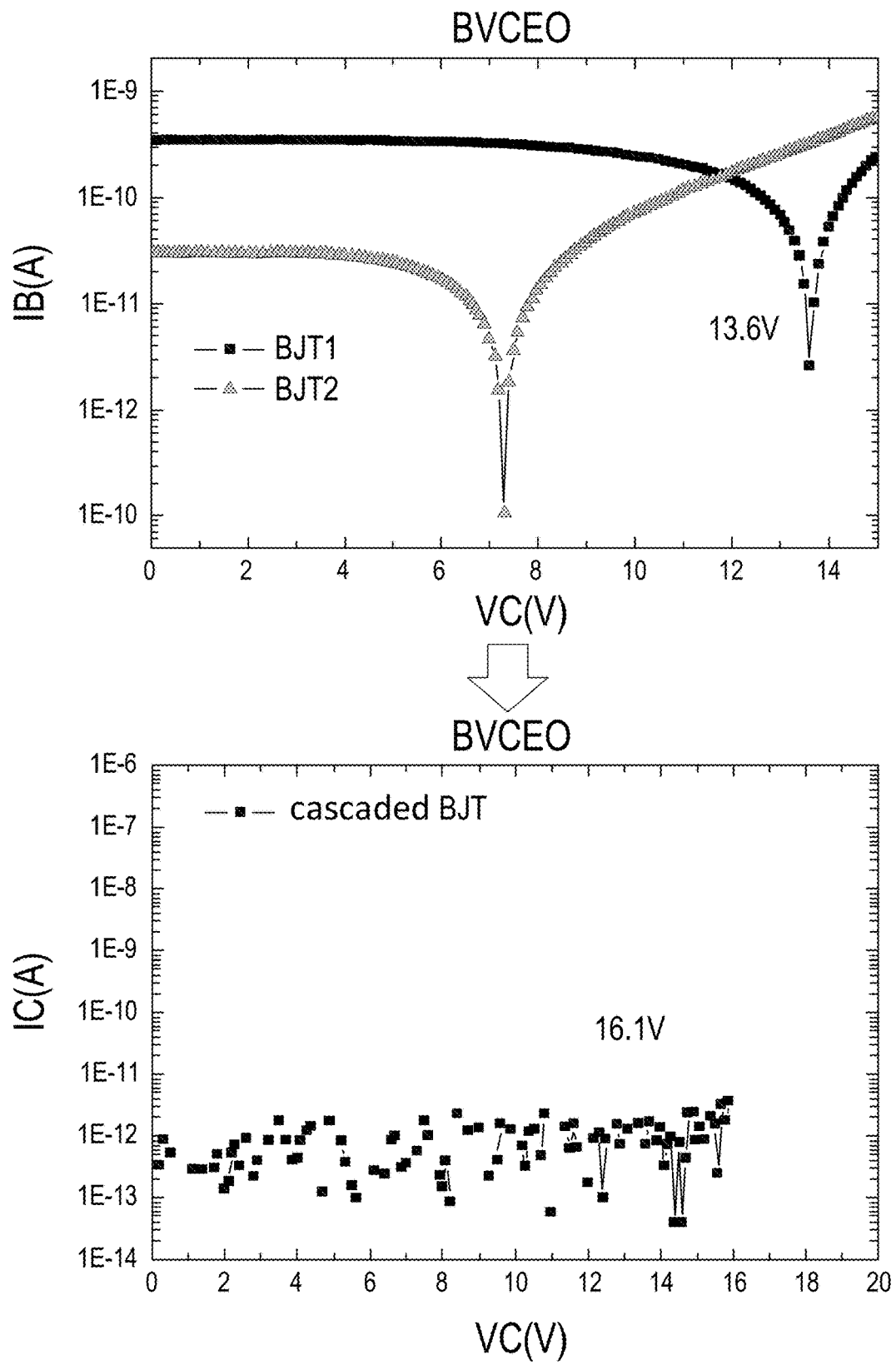
Figure 6C:
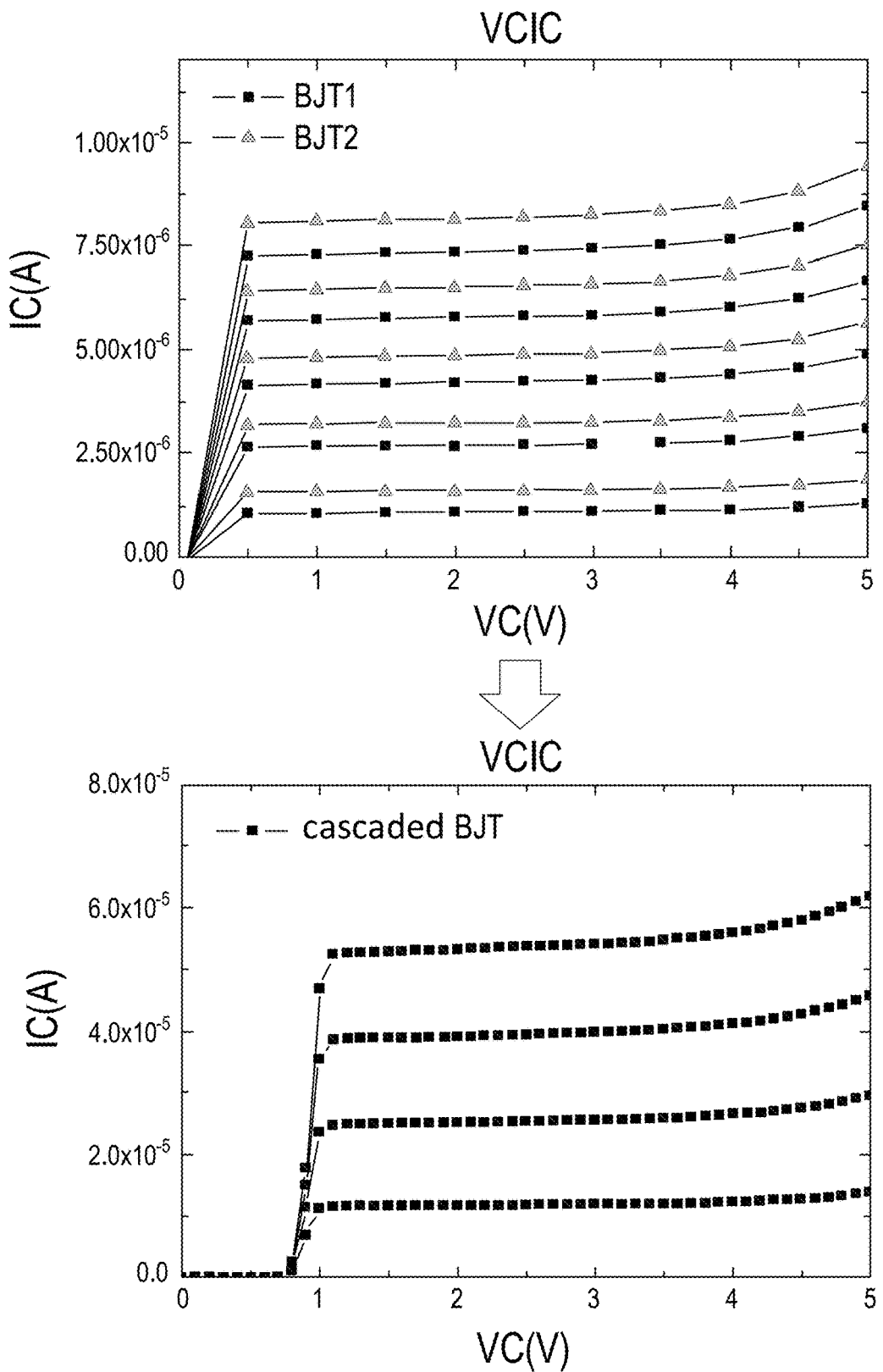

FIGS. 6A-6C are charts showing comparisons of individual low gain BJTs and low gain cascaded BJT, in accordance with some embodiments. As shown in FIG. 6A, low gain BJT1 and low gain BJT2 each has a maximum beta gain of around 8. After connecting the low gain BJT1 and the low gain BJT2 to form a low gain cascaded BJT, such as the cascaded BJT 100, the beta gain of the low gain cascaded BJT is increased to about 75, which is almost 10 times the beta gain of the individual low gain BJTs. The low gain BJT1 may be the BJT 104, and the low gain BJT2 may be the BJT 102 shown in FIG. 2A. As shown in FIG. 6B, the low gain BJT1 has a $BV_{CEO}$ of around 13.6V, and the low gain BJT2 has a $BV_{CEO}$ of around 7.1V. As described above, the BJT 104, or the low gain BJT 1, has a higher $BV_{CEO}$ in order for the cascaded low gain BJT to have an increased $BV_{CEO}$. As shown in FIG. 6B, the cascaded low gain BJT has a $BV_{CEO}$ of 16.1V, which is higher than the $BV_{CEO}$ of the low gain BJT1 and low gain BJT2. FIG. 6C shows the difference in turn on voltage between the individual low gain BJT1, BJT2 and the low gain cascaded BJT. The turn on voltage of the low gain cascaded BJT may be twice as much the turn on voltage of the individual low gain BJT1, BJT2.

Figure 7A:
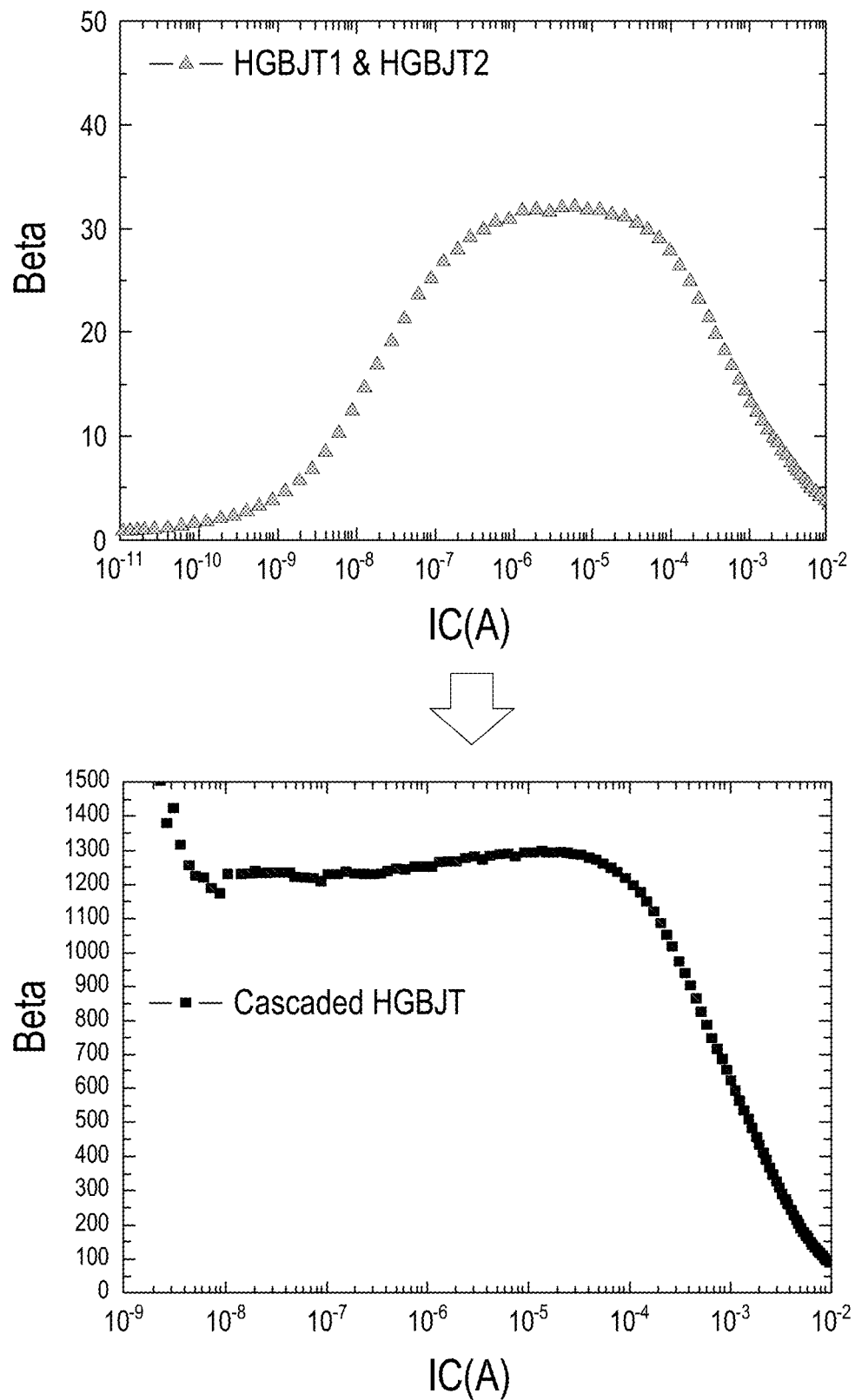
FIGS. 7A-7C are charts showing comparisons of individual high gain BJTs and high gain cascaded BJT, in accordance with some embodiments.
Figure 7B:
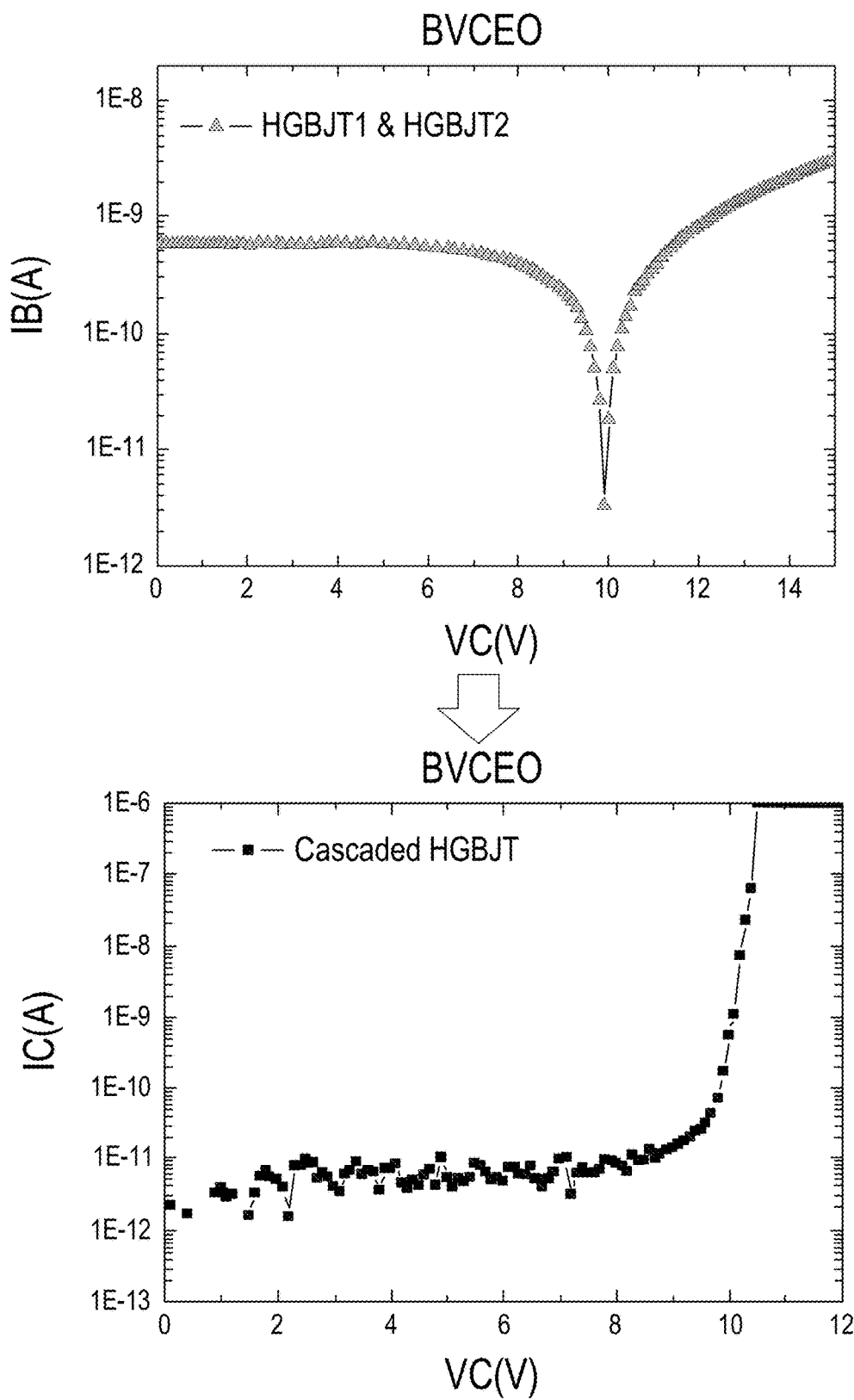
Figure 7C:
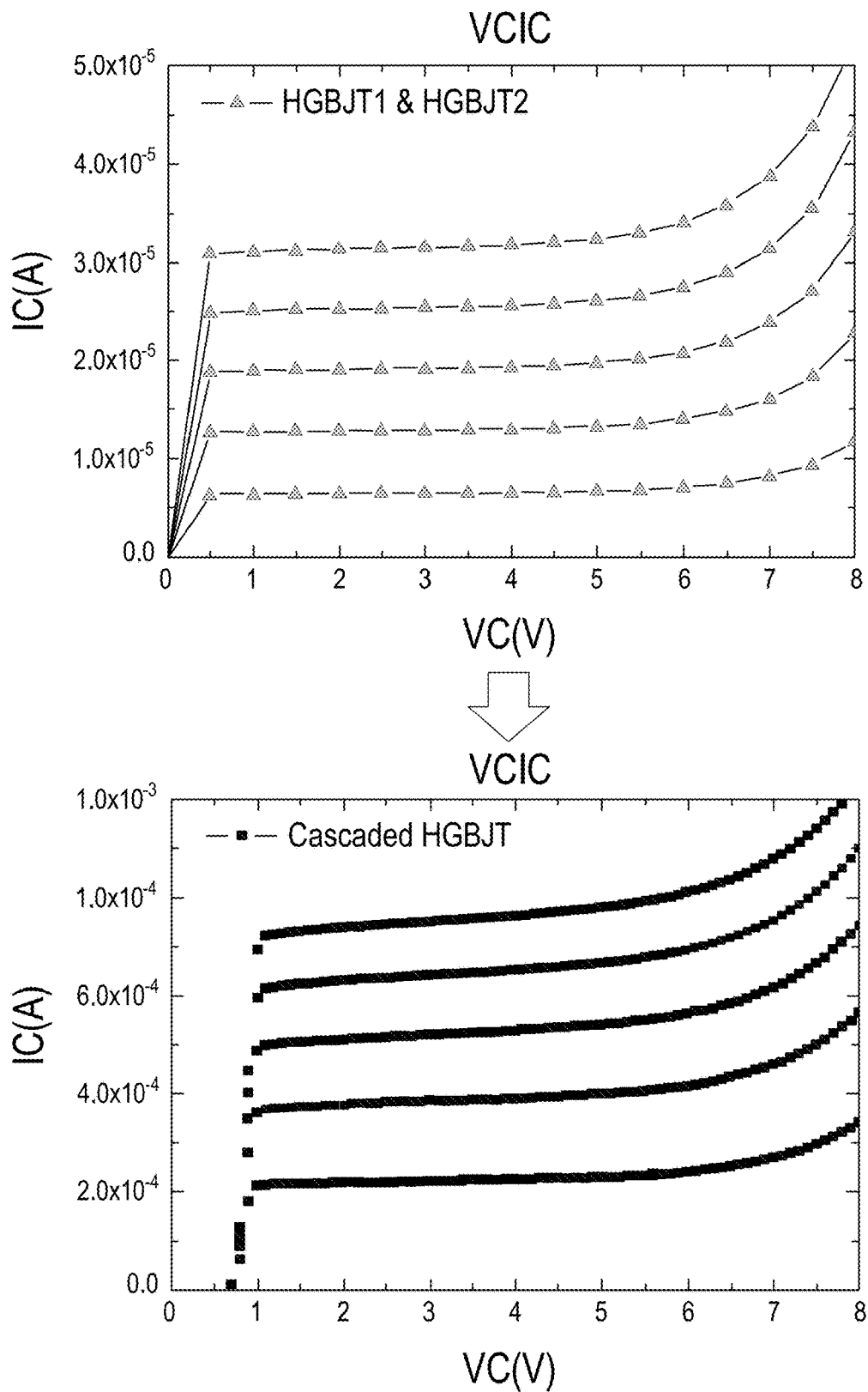

FIGS. 7A-7C are charts showing comparisons of individual high gain BJTs and high gain cascaded BJT, in accordance with some embodiments. As shown in FIG. 7A, identical high gain BJT1, BJT2 have a maximum beta gain of around 32. After connecting the high gain BJT1 and the high gain BJT2 to form a high gain cascaded BJT, such as the cascaded BJT 100, the beta gain of the high gain cascaded BJT is increased to about over 1200. As shown in FIG. 7B, the high gain BJT1, BJT2 have a $BV_{CEO}$ of around 10V, and cascaded high gain BJT also has a $BV_{CEO}$ of around 10V. FIG. 6C shows the difference in turn on voltage between the individual high gain BJT1, BJT2 and the high gain cascaded BJT. The turn on voltage of the high gain cascaded BJT may be twice as much the turn on voltage of the individual high gain BJT1, BJT2.

The charts shown in FIGS. 6A to 6C and 7A to 7C illustrates the cascaded BJT, such as the cascaded BJT 100, has increased beta gain while at least maintaining the $BV_{CEO}$. Thus, the cascade BJT 100 decouples the inverse proportional relationship between beta gain and $BV_{CEO}$.

Furthermore, by connecting BJTs having specific beta gain profile, the resulting beta gain profile of the cascaded BJT can be tuned. For example, as shown in FIG. 6A, when two BJTs each having relatively flat beta gain profile connected to form the cascaded BJT, the beta gain profile of the cascaded BJT is relatively steep compared to the beta gain profile of the cascaded BJT shown in FIG. 7A, which is connected by two BJTs each having relatively steep beta gain profile. Cascaded BJT having different beta gain profiles may be used in different applications.

Figure 8A:
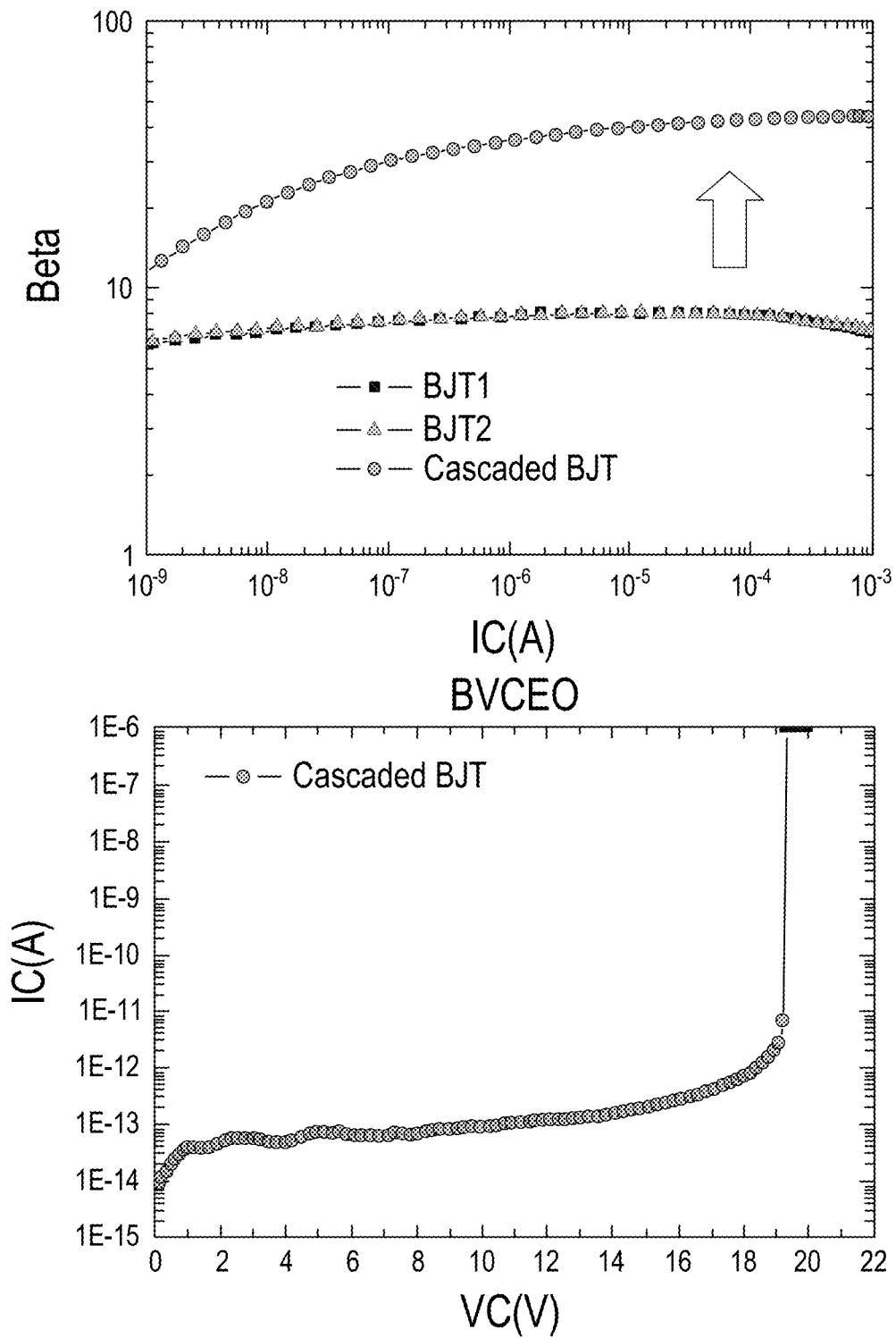
FIGS. 8A and 8B are charts showing comparisons of individual BJTs and cascaded BJT, in accordance with some embodiments.
Figure 8B:
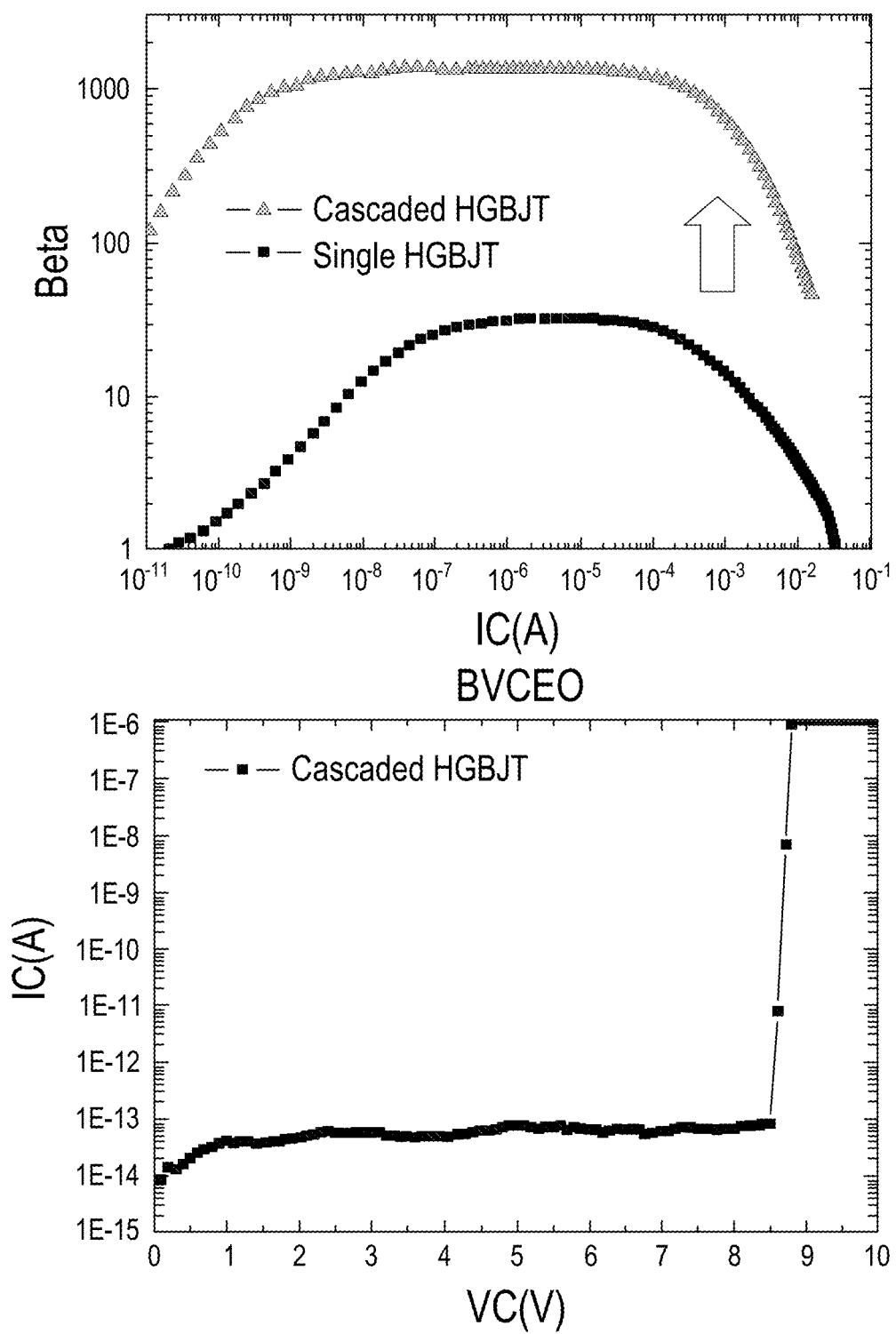

FIGS. 8A and 8B are charts showing comparisons of individual BJTs and cascaded BJT, in accordance with some embodiments. As shown in FIG. 8A, the beta gain of the low gain cascaded BJT is substantially higher than the beta gain of the individual low gain BJT1, BJT2. The $BV_{CEO}$ of the low gain cascaded BJT remains substantially high. As shown in FIG. 8B, the beta gain of the high gain cascaded BJT is substantially higher than the beta gain of the individual high gain BJT1, BJT2. The $BV_{CEO}$ of the high gain cascaded BJT remains substantially high.

Figure 9A:
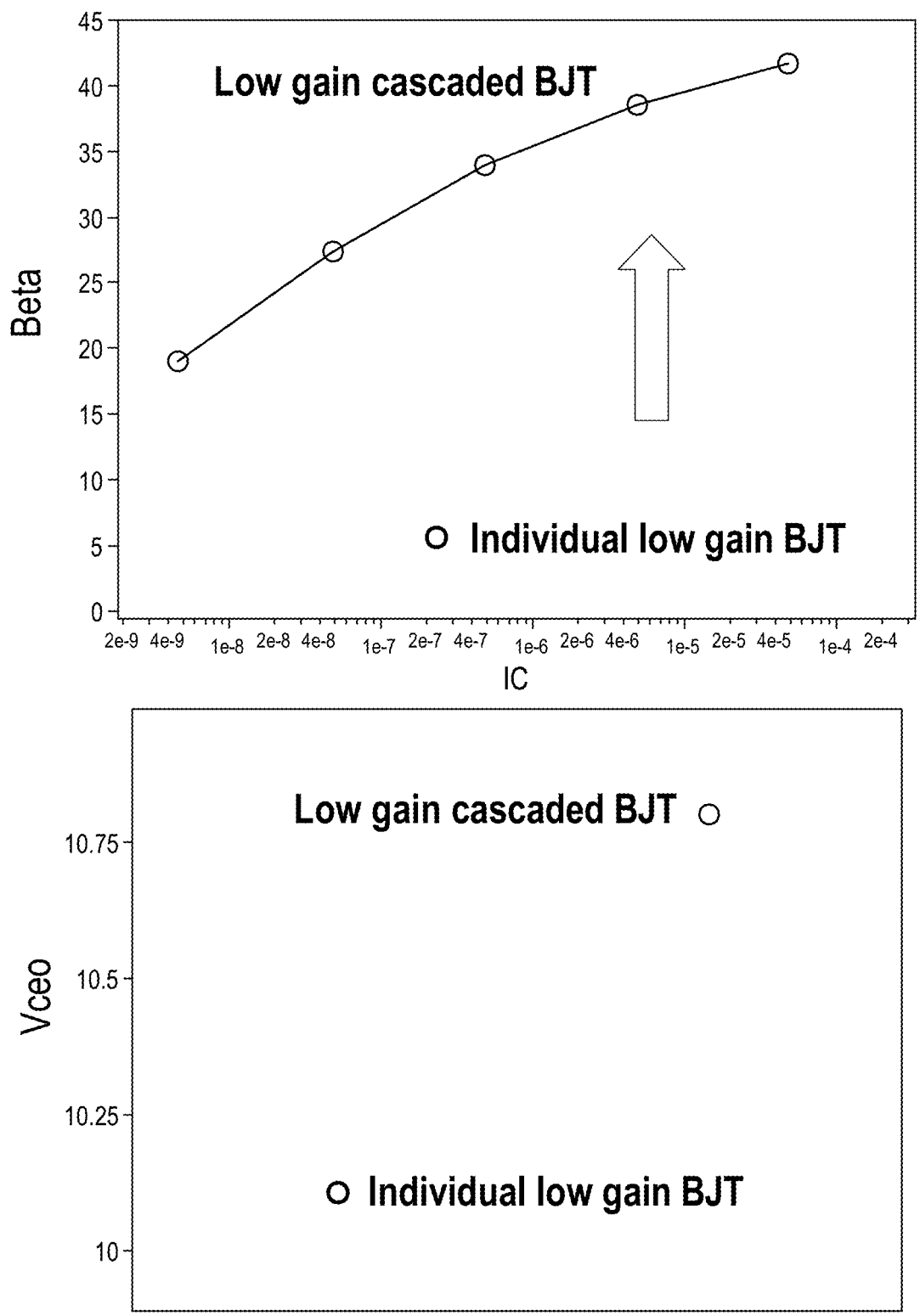
FIGS. 9A and 9B are charts showing comparisons of individual BJTs and cascaded BJT, in accordance with some embodiments.
Figure 9B:
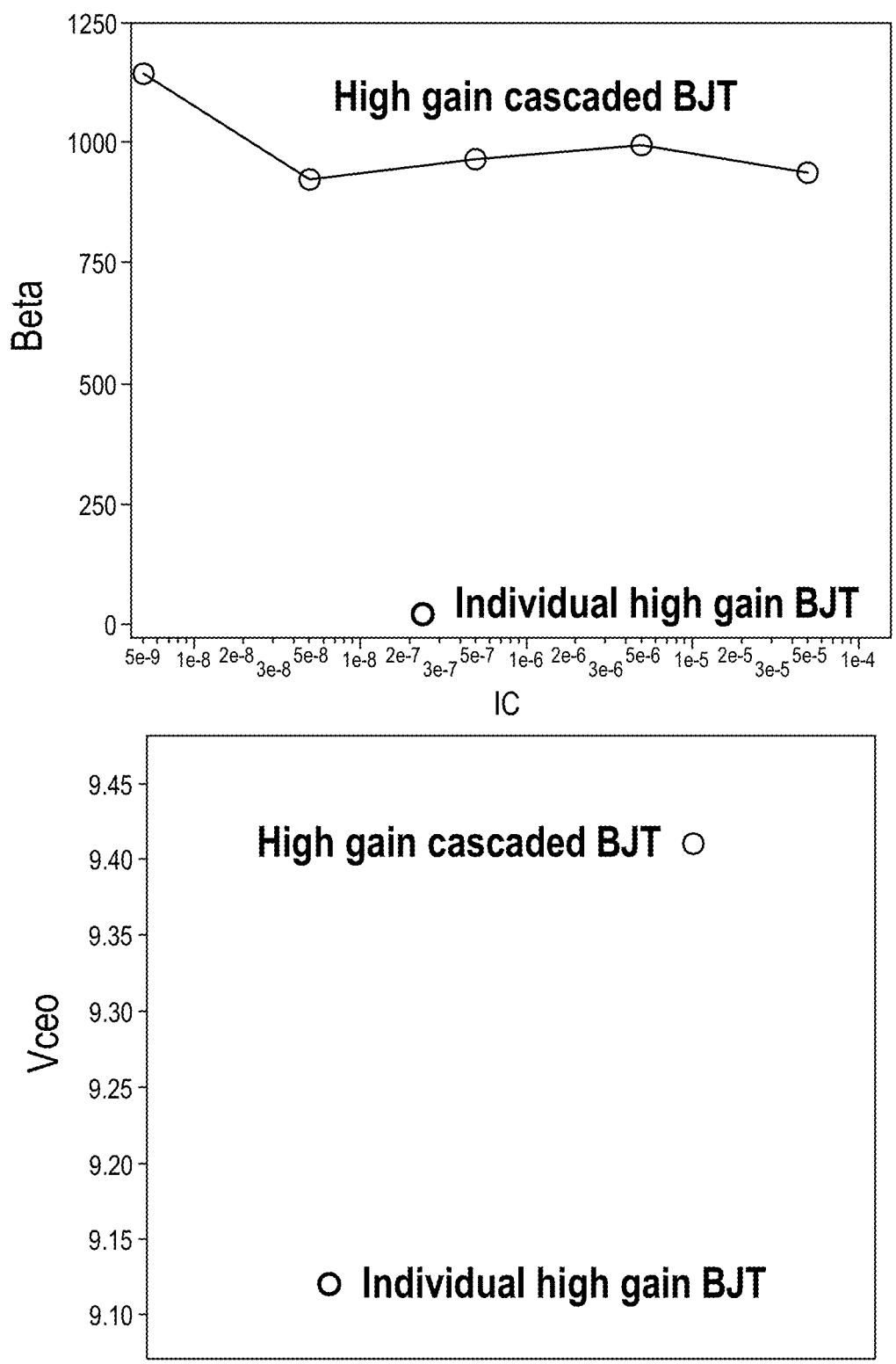

FIGS. 9A and 9B are charts showing comparisons of individual BJTs and cascaded BJT, in accordance with some embodiments. As shown in FIG. 9A, the beta gain of the low gain cascaded BJT is substantially higher than the beta gain of the individual low gain BJT. The $BV_{CEO}$ of the low gain cascaded BJT is higher than the $BV_{CEO}$ of individual low gain BJT. As shown in FIG. 9B, the beta gain of the high gain cascaded BJT is substantially higher than the beta gain of the individual high gain BJT. The $BV_{CEO}$ of the high gain cascaded BJT is higher than the $BV_{CEO}$ of individual high gain BJT.

Figures 10A, 10B:
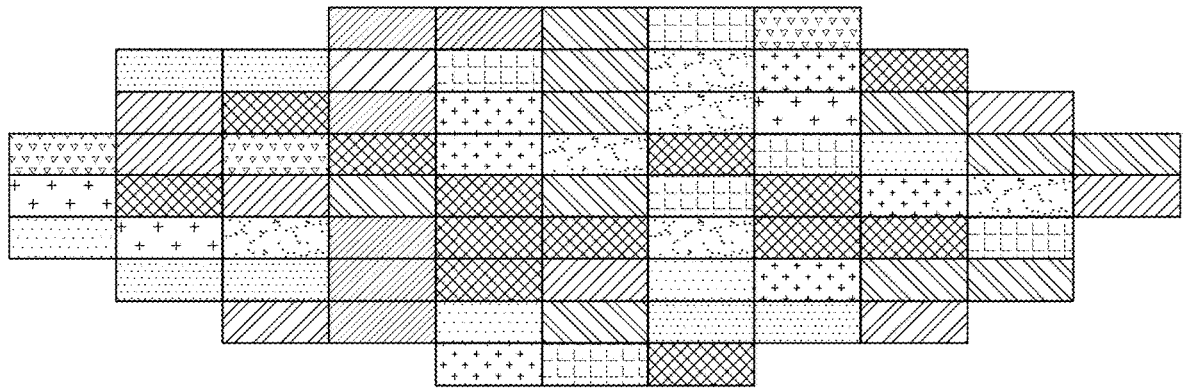
FIG. 10A is a plan view of a substrate including a plurality of BJTs, in accordance with some embodiments.
FIG. 10B is a table showing comparisons of individual BJTs and cascaded BJT, in accordance with some embodiments.

FIG. 10A is a plan view of a substrate including a plurality of BJTs, in accordance with some embodiments. The substrate may be the substrate 106 shown in FIG. 2A, and the BJTs may be the BJTs 102, 104 shown in FIG. 2A. The plurality of BJTs has different beta gains shown in different patterns. FIG. 10B is a table showing the yield improvement of the cascaded BJT. For example, if the plurality of BJTs shown in FIG. 10A are low gain BJTs not connected to form cascaded BJT, such as the cascade BJT 100, the mean beta gain is about the standard deviation is about 0.021, and the uniformity (standard deviation over mean beta gain) is about 0.39 percent. If the plurality of BJTs shown in FIG. 10A are high gain BJTs not connected to form cascaded BJT, the mean beta gain is about 39.7, the standard deviation is about 1.442, and the uniformity is about 3.63 percent, which is substantially higher than the 0.39 percent of low gain BJTs. If the plurality of BJTs are low gain BJTs connected to form cascaded BJT, the mean beta gain is about 38.5, the standard deviation is about 0.25, and the uniformity is about 0.64 percent. Thus, the low gain cascaded BJT has similar beta gain as high gain individual BJTs, but the uniformity of the low gain cascaded BJT is much better than the uniformity of the high gain individual BJTs. The benefit of the improved uniformity comes from the electrical connections in the interconnect structure 200 (FIG. 2A), because the process to form high gain BJTs may be more complex compared to the process of the low gain BJTs.

The present disclosure provides a cascaded BJT 100 including a first BJT 102 connected to a second BJT 104. The connections are formed in an interconnect structure 200. Some embodiments may achieve advantages. For example, the cascaded BJT 100 is compatible with the standard BCD process, and the electrical resistance of the cascaded BJT 100 is low due to the proximity of the BJTs 102, 104 and the interconnect structure 200. Furthermore, the cascaded BJT 100 can provide high beta gain while maintain or improve $BV_{CEO}$.

An embodiment is a device. The device includes a substrate and a first bipolar junction transistor (BJT) disposed over the substrate. The first BJT includes a first base region, a first emitter region, and a first collector region. The device further includes a second BJT disposed over the substrate adjacent the first BJT, and the second BJT includes a second base region, a second emitter region, and a second collector region. The device further includes an interconnect structure disposed over the first and second BJTs, and the interconnect structure includes a first conductive line electrically connected to the first emitter region and the second base region and a second conductive line electrically connected to the first collector region and the second collector region.

Another embodiment is a device. The device includes a substrate and a first bipolar junction transistor (BJT) disposed over the substrate. The first BJT includes a first base region, a first emitter region, and a first collector region. The device further includes a second BJT disposed over the substrate adjacent the first BJT, and the second BJT includes a second base region, a second emitter region, and a second collector region. The device further includes an interconnect structure disposed over the first and second BJTs, and the interconnect structure includes a first conductive line electrically connecting the first collector region and the second collector region, where the first conductive line comprises a first portion and second portions extending from edges of the first portion when viewed from top.

A further embodiment is a cascaded bipolar junction transistor (BJT). The cascaded BJT includes a first BJT disposed over a substrate and a second BJT disposed over the substrate. The first and second BJTs are asymmetric with respect to a portion of a region disposed between the first BJT and the second BJT. The cascaded BJT further includes an interconnect structure disposed over the first BJT and the second BJT, and the interconnect structure includes a first conductive line electrically connected to an emitter region of the first BJT and a base region of the second BJT and a second conductive line electrically connected to a collector region of the first BJT and a collector region of the second BJT.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:
1. A device, comprising:
a substrate;
a first bipolar junction transistor (BJT) disposed over the substrate, the first BJT comprising:
a first base region;
a first emitter region; and
a first collector region;

a second BJT disposed over the substrate adjacent the first BJT, the second BJT comprising:
  a second base region;
  a second emitter region; and
  a second collector region;
a first isolation region surrounding the first BJT;
a second isolation region surrounding the second BJT; and
an interconnect structure disposed over the first and second BJTs, wherein the interconnect structure comprises:
  a first conductive line electrically connected to the first emitter region and the second base region; and
  a second conductive line electrically connected to the first collector region and the second collector region, wherein the second conductive line comprises a first portion, a second portion parallel to the first portion, and a third portion connecting the first and second portions, the first portion is disposed directly over the first collector region and the first isolation region, and the second portion is disposed directly over the second collector region and the second isolation region.

2. The device of claim 1, wherein the second conductive line is disposed at a level above a level of the first conductive line in the interconnect structure.

3. The device of claim 1, wherein the first base region and the first collector region each has a first continuous loop layout.

4. The device of claim 3, wherein the first continuous loop layout is a square loop layout.

5. The device of claim 3, wherein the second base region and the second collector region each has a second continuous loop layout.

6. The device of claim 5, wherein the second continuous loop layout is the same as the first continuous loop layout.

7. The device of claim 5, wherein the second continuous loop layout is different from the first continuous loop layout.

8. The device of claim 5, wherein the second continuous loop layout is a rectangular loop layout.

9. The device of claim 1, further comprising a third conductive line electrically connected to the first base region, wherein the third conductive line is disposed at a level between the first and second conductive lines.

10. A device, comprising:
  a substrate;
  a first bipolar junction transistor (BJT) disposed over the substrate, the first BJT comprising:
    a first base region;
    a first emitter region; and
    a first collector region;
  a second BJT disposed over the substrate adjacent the first BJT, the second BJT comprising:
    a second base region;
    a second emitter region; and
    a second collector region;
  a substrate isolation region surrounding the first and second BJTs; and
  an interconnect structure disposed over the first and second BJTs, wherein the interconnect structure comprises:
    a first conductive line electrically connecting the first collector region and the second collector region, wherein the first conductive line comprises a first portion disposed over the substrate isolation region and second portions disposed over the substrate isolation region, wherein the first portion is substantially perpendicular to the second portions.

11. The device of claim 10, wherein a gap is formed between the second portions of the first conductive line.

12. The device of claim 10, further comprising a second conductive line electrically connected to the first emitter region and the second base region.

13. The device of claim 12, further comprising a third conductive line electrically connected to the first base region.

14. The device of claim 13, further comprising a fourth conductive line electrically connected to the second emitter region.

15. The device of claim 14, wherein the first, second, and third conductive lines are located at the same level in the interconnect structure.

16. A cascaded bipolar junction transistor (BJT), comprising:
  a first BJT disposed over a substrate;
  a second BJT disposed over the substrate, wherein the first and second BJTs are asymmetric with respect to a portion of a region disposed between the first BJT and the second BJT;
  a first substrate isolation region surrounding the first BJT, wherein the first substrate isolation region comprises a first side, a second side opposite the first side, a third side connecting the first and second sides, and a fourth side opposite the third side;
  a second substrate isolation region surrounding the second BJT, wherein the second substrate isolation region comprises a fifth side, a sixth side opposite the fifth side, a seventh side connecting the fifth and sixth sides, and the fourth side, wherein the fourth side is longer than the third side, and the fifth side is longer than the first side; and
  an interconnect structure disposed over the first BJT and the second BJT, wherein the interconnect structure comprises:
    a first conductive line electrically connected to an emitter region of the first BJT and a base region of the second BJT; and
    a second conductive line electrically connected to a collector region of the first BJT and a collector region of the second BJT, wherein the second conductive line comprises two parallel first portions connected by a second portion substantially perpendicular to the two parallel first portions when viewed from top.

17. The cascaded BJT of claim 16, wherein the first BJT further comprises a base region, and the second BJT further comprises an emitter region.

18. The cascaded BJT of claim 17, further comprising:
  a first isolation region disposed between the collector region of the first BJT and the base region of the first BJT; and
  a second isolation region disposed between the collector region of the second BJT and the base region of the second BJT.

19. The cascaded BJT of claim 18, wherein the first isolation region has a square loop layout, and the second isolation region has a rectangular loop layout.

20. The cascaded BJT of claim 18, wherein a width of the second isolation region is substantially larger than a width of the first isolation region.

* * * * *